US010157297B2

(12) United States Patent
Sugimoto et al.

(10) Patent No.: US 10,157,297 B2
(45) Date of Patent: Dec. 18, 2018

(54) RFID TAG BOARD, RFID TAG, AND RFID SYSTEM

(71) Applicant: KYOCERA Corporation, Kyoto-shi, Kyoto (JP)

(72) Inventors: Yoshimasa Sugimoto, Kirishima (JP); Shuuichi Yamamoto, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/754,731

(22) PCT Filed: Jul. 21, 2017

(86) PCT No.: PCT/JP2017/026468
§ 371 (c)(1),
(2) Date: Feb. 23, 2018

(87) PCT Pub. No.: WO2018/016624
PCT Pub. Date: Jan. 25, 2018

(65) Prior Publication Data
US 2018/0268178 A1   Sep. 20, 2018

(30) Foreign Application Priority Data

Jul. 22, 2016   (JP) .................................. 2016-144488
Aug. 9, 2016   (JP) .................................. 2016-156557
Dec. 12, 2016   (JP) .................................. 2016-240400
Dec. 17, 2016   (JP) .................................. 2016-244953

(51) Int. Cl.
*G06K 7/10*        (2006.01)
*G06K 19/077*    (2006.01)

(52) U.S. Cl.
CPC ..... *G06K 7/10366* (2013.01); *G06K 19/07749* (2013.01)

(58) Field of Classification Search
None
See application file for complete search history.

(56) References Cited

U.S. PATENT DOCUMENTS 6,111,544 A    8/2000   Dakeya et al.

FOREIGN PATENT DOCUMENTS

JP    2000-101335 A    4/2000

*Primary Examiner* — Kristy A Haupt
(74) *Attorney, Agent, or Firm* — Volpe and Koenig, P.C.

(57) ABSTRACT

An RFID tag board includes an insulating substrate with an upper surface and a lower surface with a recess, an upper surface conductor on the upper surface of the insulating substrate, a ground conductor on the lower surface of the insulating substrate, the ground conductor being electrically connected to the upper surface conductor by a short-circuit portion through conductor penetrating the insulating substrate in a thickness direction, a capacitance conductor in the insulating substrate, the capacitance conductor facing a portion of the upper surface conductor, a capacitance portion through conductor penetrating the insulating substrate in the thickness direction from the capacitance conductor to the ground conductor, and a first electrode and a second electrode in the recess, the first electrode electrically connected to the capacitance conductor or the ground conductor by a first connection conductor, the second electrode electrically connected to the upper surface conductor via a second connection conductor.

20 Claims, 15 Drawing Sheets

RFID TAG BOARD, RFID TAG, AND RFID SYSTEM

TECHNICAL FIELD

The present disclosure relates to a radio frequency identification (RFID) tag board that transmits and receives information via a radio wave, an RFID tag, and an RFID system.

BACKGROUND ART

Detecting and managing information on various articles by using an RFID tag mounted on an article have become widely used techniques. As the RFID tag, an RFID tag that includes an antenna conductor for performing transmission and reception of information by using a radio wave in an ultra-high frequency (UHF) band or the like and a semiconductor element such as an integrated circuit (IC) or the like is in wide use now.

Information is transmitted and received between the antenna conductor of the RFID tag and an external device such as a reader/writer having a function of transmitting and receiving a radio wave. A signal that is transmitted and received is, for example, stored or retrieved in the semiconductor element. The semiconductor element also functions as a power supply unit for the antenna conductor (for example, refer to PTL 1).

CITATION LIST

Patent Literature

PTL 1: Japanese Unexamined Patent Application Publication No. 2000-101335

SUMMARY OF INVENTION

An RFID tag board according to an embodiment of the disclosure includes an insulating substrate with an upper surface and a lower surface with a recess, an upper surface conductor on the upper surface of the insulating substrate, a ground conductor on the lower surface of the insulating substrate, the ground conductor being electrically connected to the upper surface conductor by a short-circuit portion through conductor that penetrates the insulating substrate in a thickness direction, a capacitance conductor in the insulating substrate, the capacitance conductor facing a portion of the upper surface conductor, a capacitance portion through conductor that penetrates the insulating substrate in the thickness direction from the capacitance conductor to the ground conductor, and a first electrode and a second electrode in the recess, the first electrode being electrically connected to the capacitance conductor or the ground conductor by a first connection conductor and the second electrode being electrically connected to the upper surface conductor via a second connection conductor.

An RFID system according to an embodiment of the disclosure includes a reader/writer including an antenna that transmits and receives a radio wave to and from an upper surface conductor of the RFID tag configured as described above.

BRIEF DESCRIPTION OF DRAWINGS

FIG. 9A is a bottom view and FIG. 9B is an exploded perspective view of FIG. 9A.

FIG. 13A is a sectional view and FIG. 13B is a bottom view.

FIG. 14A is a sectional view and FIG. 14B is a bottom view.

FIG. 15A is a sectional view and FIG. 15B is a bottom view.

FIG. 16A is a sectional view and FIG. 16B is a bottom view.

FIG. 17A is a sectional view and FIG. 17B is a bottom view.

DESCRIPTION OF EMBODIMENTS

In an RFID tag in the related art, since a semiconductor element is mounted on an outer surface of an RFID tag board, it is difficult to improve the reliability of connection between the semiconductor element and the RFID tag board. With respect to the RFID tag, there is a demand for a high-gain antenna property or a wide-bandwidth antenna property. Reduction in size is one of major demands for the RFID tag. With the RFID tag board in the related art, it is difficult to realize the plurality of demands at the same time.

According to an RFID tag board in an embodiment of the disclosure, since conductor portions having the above-described configuration are provided, an upper surface conductor can function as an inverted-F antenna in accordance with electrical connection between a short-circuit portion through conductor, a second electrode, and an upper surface conductor. In addition, a semiconductor element is located in a recess of an insulating substrate. The recess is provided on a lower surface that is opposite to an upper surface of the insulating substrate on which the upper surface conductor is provided, and a capacitance conductor that faces the upper surface conductor is provided. Therefore, it is possible to achieve reduction in size while improving the reliability of connection between the semiconductor element and the RFID tag board and good basic antenna properties can be achieved with a relatively large upper surface conductor. Furthermore, a higher gain or a wider bandwidth can be achieved depending on where a first electrode is connected to.

An RFID tag board, an RFID tag, and an RFID system according to embodiments of the disclosure will be described with reference to attached drawings. Note that, upper and lower sides are determined for convenience of explanation in the following description and upper and lower sides at the time of actual use of the RFID tag board, the RFID tag, and the RFID system are not limited thereto.

Figure 1A:
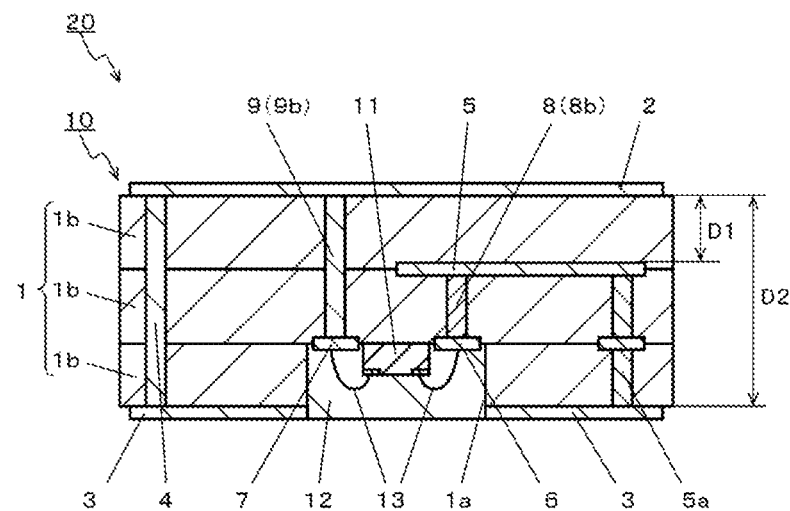
FIGS. 1A and 1B are sectional views illustrating an example of an RFID tag according to a first embodiment.
Figure 1B:
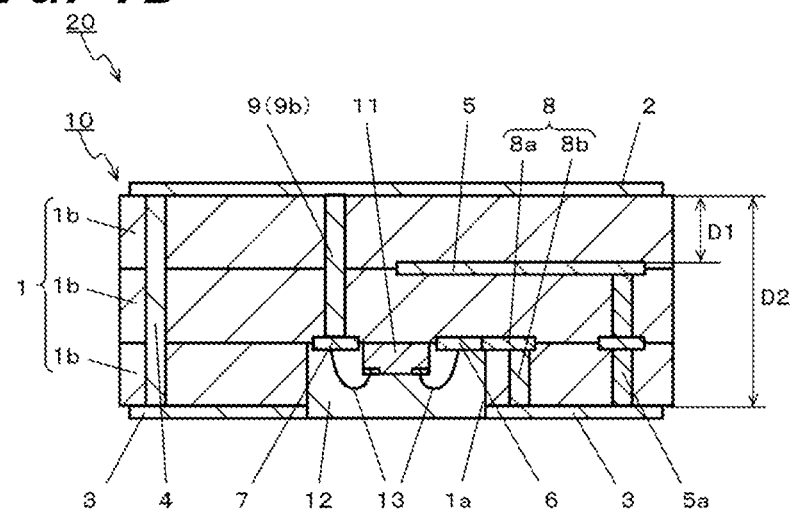
Figure 2A:
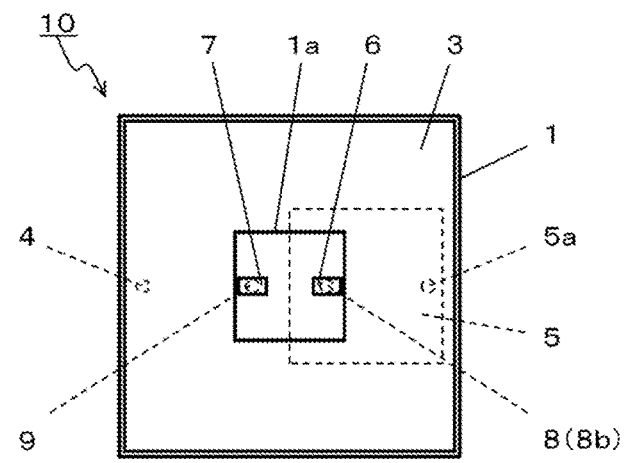
FIG. 2A is a bottom view illustrating an example of an RFID tag board in an example illustrated in FIG. 1A as seen from a lower surface side and FIG. 2B is an exploded perspective view of FIG. 2A.
Figure 2B:
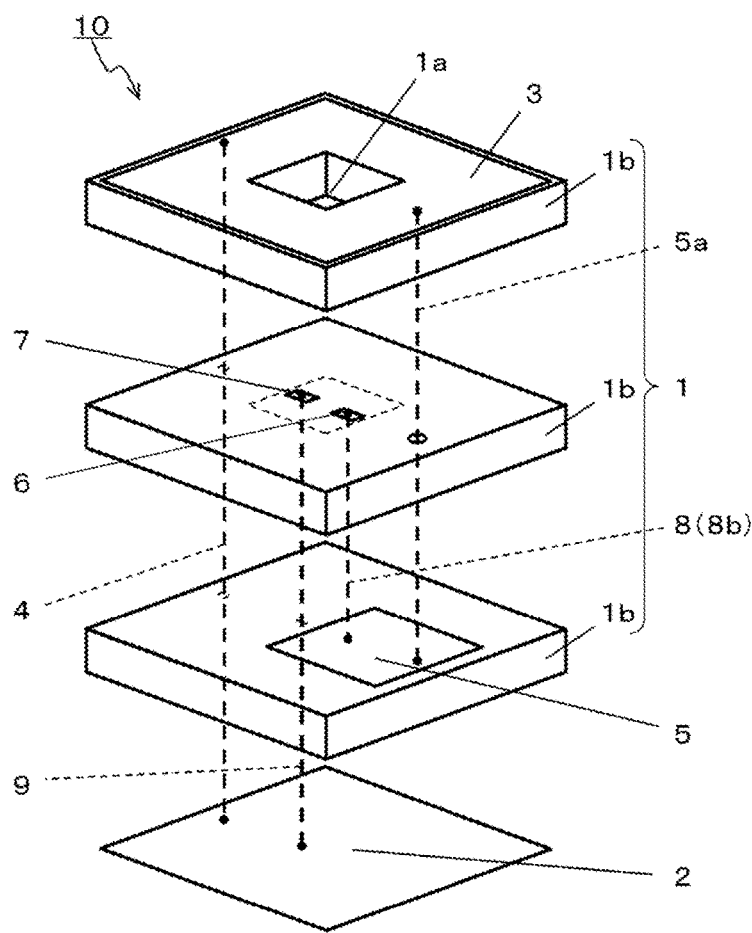
Figure 3A:
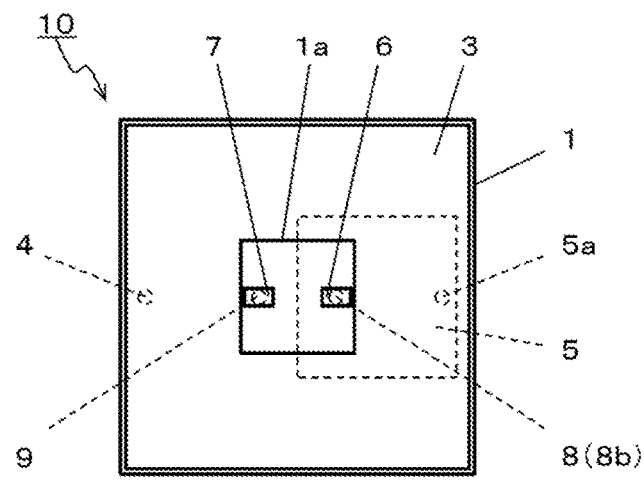
FIG. 3A is a bottom view illustrating an example of the RFID tag board in an example illustrated in FIG. 1B as seen from the lower surface side and FIG. 3B is an exploded perspective view of FIG. 3A.
Figure 3B:
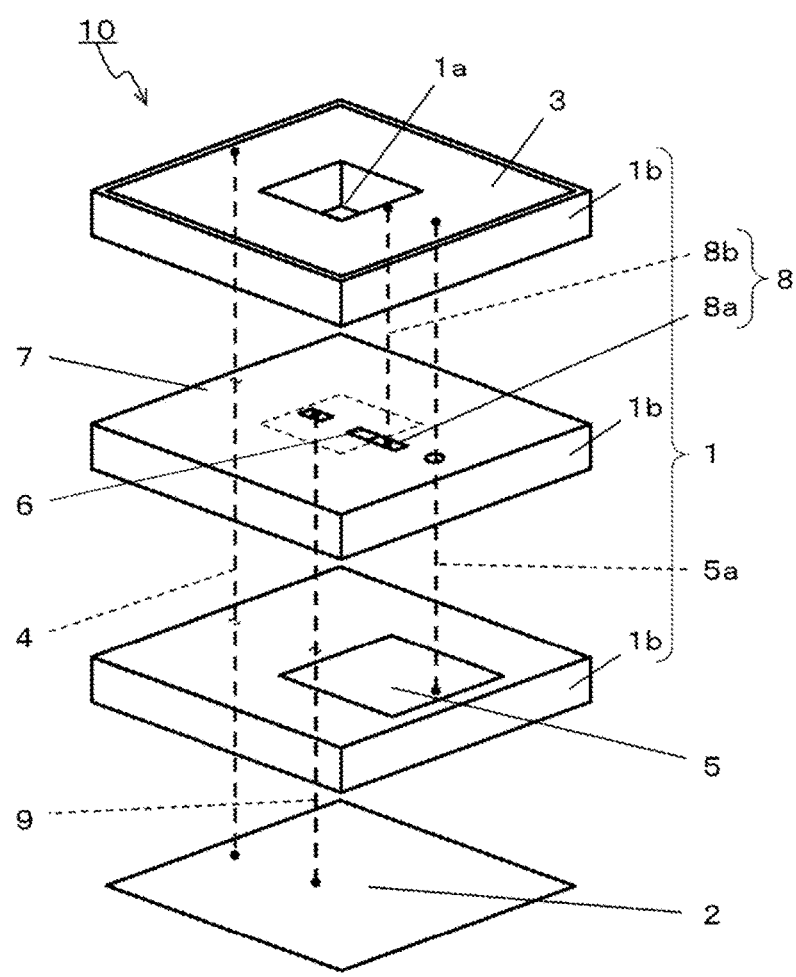
Figure 4:
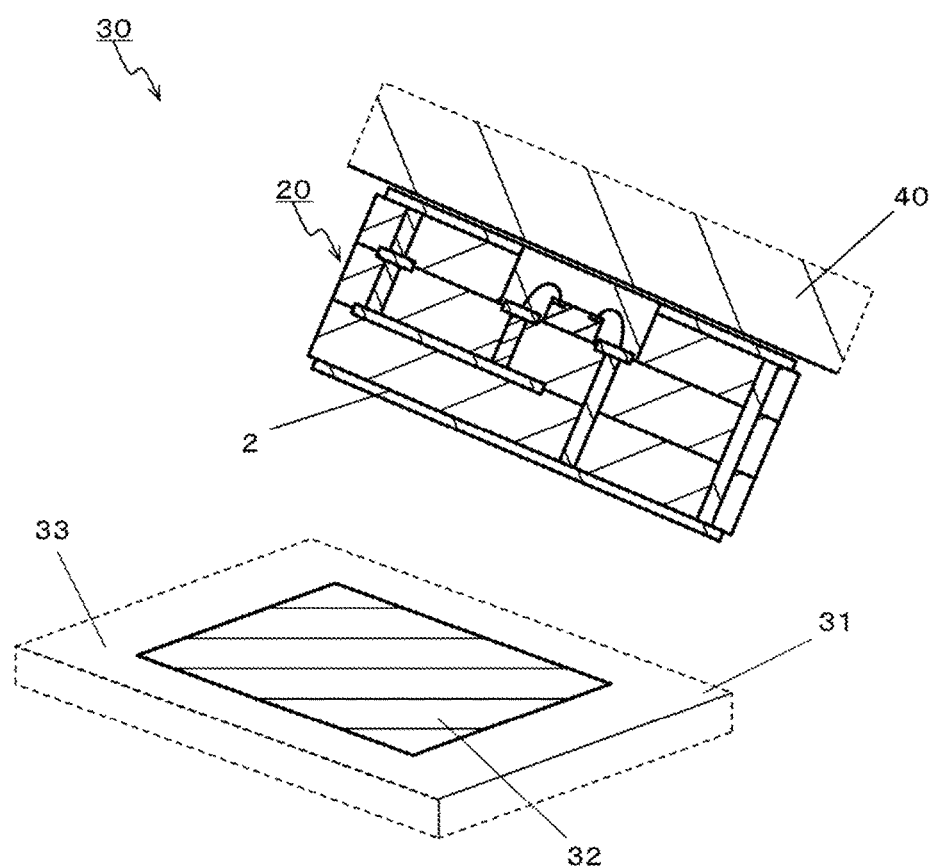
FIG. 4 is a schematic view illustrating an example of an RFID system according to an embodiment of the disclosure.

FIGS. 1A and 1B are sectional views illustrating an RFID tag according to a first embodiment. In an RFID tag 20 in FIG. 1A, a first electrode 6 of an RFID tag board 10 is connected to a capacitance conductor 5 by a first connection conductor 8. Meanwhile, in the RFID tag 20 in FIG. 1B, the first electrode 6 of the RFID tag board 10 is connected to a ground conductor 3 by the first connection conductor 8. FIG. 2A is a bottom view illustrating an example of an exemplary RFID tag board illustrated in FIG. 1A and FIG. 2B is an exploded perspective view (an exploded perspective view as seen from a lower surface side) of FIG. 2A. FIG. 3A is a bottom view illustrating an example of an exemplary RFID tag board illustrated in FIG. 1B and FIG. 3B is an exploded perspective view (an exploded view as seen from a lower surface side) of FIG. 3A. In FIGS. 2A to 3B, each through conductor is represented by a broken line and connection portions at the opposite ends thereof are represented by black points. FIG. 4 is a schematic view illustrating an RFID system according to the embodiment of the disclosure and includes a sectional view of the RFID tag illustrated in FIG. 1A and a perspective view of a reader/writer.

(RFID Tag Board and RFID Tag)

The RFID tag 20 according to the embodiment includes the RFID tag board 10 and a semiconductor element 11 in the RFID tag board 10. The RFID tag board 10 includes, for example, a flat plate-shaped insulating substrate 1 provided with an upper surface and a lower surface with a recess 1a, conductor portions (details will be described later) including an antenna conductor that are provided in the insulating substrate 1, and the like. The semiconductor element 11 is mounted in the recess 1a (of the insulating substrate 1) of the RFID tag board 10. The semiconductor element 11 is electrically connected to the first electrode 6 and a second electrode 7 of the RFID tag board 10 in the recess 1a. As in an example illustrated in FIG. 1B, the recess 1a may be filled with sealing resin 12 and the semiconductor element 11 may be sealed by being covered by the sealing resin 12.

As described above, since the RFID tag board 10 is provided with the recess 1a, the reliability of connection between the semiconductor element 11 and the RFID tag board 10 is improved in comparison with the semiconductor element 11 that is mounted on an outer surface of the RFID tag board 10. When the semiconductor element 11 in the recess 1a, the first electrode 6, and the second electrode 7 are sealed by the sealing resin 12, contact between these components and the outside air is suppressed, and thus the reliability as the RFID tag 20 is further improved.

The above-described conductor portions include an upper surface conductor 2 on an upper surface of the insulating substrate 1, the ground conductor 3 on a lower surface of the insulating substrate 1 that is electrically connected to the upper surface conductor 2 by a short-circuit portion through conductor 4 that penetrates the insulating substrate 1 in a thickness direction, the capacitance conductor 5 in the insulating substrate 1 that faces a portion of the upper surface conductor 2, and a capacitance portion through conductor 5a that penetrates the insulating substrate 1 in the thickness direction from the capacitance conductor 5 to the ground conductor 3. The above-described conductor portions include the first electrode 6 in the recess 1a that is electrically connected to the capacitance conductor 5 or the ground conductor 3 by the first connection conductor 8 and the second electrode 7 in the recess 1a that is electrically connected to the upper surface conductor 2 via a second connection conductor 9. In an example illustrated in FIG. 1A, the first electrode 6 is connected to the capacitance conductor 5 by the first connection conductor 8 (a first through conductor 8b). In the example illustrated in FIG. 1B, the first electrode 6 is connected to the ground conductor 3 by the first connection conductor 8 (a first internal wiring conductor 8a and the first through conductor 8b). In the examples illustrated in FIGS. 1A and 1B, the second electrode 7 is connected to the upper surface conductor 2 by the second connection conductor 9 (a second through conductor 9b).

Power supply to the upper surface conductor 2 that functions as the antenna conductor as described later is performed by a power supply unit that includes the above-described first electrode 6, the above-described second electrode 7, and the semiconductor element (a semiconductor integrated circuit element) 11 such as an IC.

In the RFID tag 20 according to the embodiment, the first electrode 6 and the second electrode 7 are provided on a bottom surface of the recess 1a. In an example illustrated in FIGS. 1A and 1B, the first electrode 6 and the second electrode 7 are electrically connected to terminals (with no reference numeral) of the semiconductor element 11 via bonding wires 13. The first electrode 6 and the second electrode 7 are power supply units for the upper surface conductor 2 and the first electrode 6 and the terminal of the semiconductor element 11 are electrically connected to an end portion of the upper surface conductor 2 via the first connection conductor 8, the short-circuit portion through conductor 4, and the like. The second electrode 7 and the terminal of the semiconductor element 11 are electrically connected to a portion of the upper surface conductor 2, which is closer to the central portion than the above-described end portion, via another conductor (the second connection conductor 9) in the insulating substrate 1. Description on details of an antenna function including these power supply units is later given.

In the example illustrated in FIG. 1A, the first through conductor 8b that penetrates the insulating substrate 1 in the thickness direction from the inside of the recess 1a (the first electrode 6) to the capacitance conductor 5 is provided. The first electrode 6 and the capacitance conductor 5 are electrically connected to each other by the first through conductor 8b. In this example, the first through conductor 8b is the first connection conductor 8 and is also included in the above-described conductor portions.

In the example illustrated in FIG. 1B, the first internal wiring conductor 8a is provided from the inside of the recess 1a (the first electrode 6) to the inside of the insulating substrate 1 and the first through conductor 8b that penetrates the insulating substrate 1 in the thickness direction from the first internal wiring conductor 8a to the ground conductor 3 is provided. The first electrode 6 and the ground conductor 3 are electrically connected to each other by the first internal wiring conductor 8a and the first through conductor 8b. In this example, the first internal wiring conductor 8a and the first through conductor 8b constitute the first connection conductor 8 and are also included in the above-described conductor portions.

The first electrode 6 and the first internal wiring conductor 8a are substantially integrated with each other. Therefore, in the example illustrated in FIG. 1B, the first internal wiring conductor 8a may be regarded as an outer end portion of the first electrode 6 extending to the inside of the insulating substrate 1 (between insulating layers 1b which is described later). Alternatively, the first electrode 6 may be regarded as a portion of the first internal wiring conductor 8a. The first internal wiring conductor 8a does not need to be formed into one linear conductor having the same width as the first electrode 6 as in an example illustrated in FIG. 3B and, for example, the first internal wiring conductor 8a may have a portion with a width larger than that of the first electrode 6 and may have an angled portion as seen in plan view. As described below, in order to shorten a wiring length between the first electrode 6 and the second electrode 7, the first internal wiring conductor 8a may be a short conductor that linearly extends up to a connection portion between the first internal wiring conductor 8a and the first through conductor 8b.

According to the RFID tag board 10 in the present embodiment, since the conductor portions having the above-described configuration are provided, the upper surface conductor 2 can function as an inverted-F antenna in accordance with electrical connection between the short-circuit portion through conductor 4, the second electrode 7, and the upper surface conductor 2. The recess 1a of the insulating substrate 1 is provided on a lower surface that is opposite to the upper surface of the insulating substrate 1 on which the upper surface conductor 2 is provided. Therefore, the upper surface conductor 2 can be provided over the entire upper surface of the insulating substrate 1 on which no recess 1a is present and thus the area of the upper surface conductor 2 is increased. Since the upper surface conductor 2, which is a main transmission and reception unit of a radio wave in an antenna, is large, the RFID tag board 10 is a high-gain antenna board that is basically small.

Since the capacitance conductor 5 is provided in the insulating substrate 1, it is possible to reduce the size of the RFID tag board 10. Since the capacitance conductor 5 faces the upper surface conductor 2 with no opening formed by the recess 1a, it is possible to increase the size of the capacitance conductor 5, it is possible to increase the capacitance formed between the capacitance conductor 5 and the upper surface conductor 2, and it is possible to reduce the size of the RFID tag board 10.

It is possible to further improve the antenna properties depending on whether the first electrode 6 is connected to the capacitance conductor 5 by the first connection conductor 8 or the first electrode 6 is connected to the ground conductor 3.

In the example illustrated in FIG. 1A, the first electrode 6 and the capacitance conductor 5 are electrically connected to each other by the first connection conductor 8 (the first through conductor 8b). In other words, the first electrode 6 is electrically connected to the ground conductor 3 via the first connection conductor 8 (the first through conductor 8b), the capacitance conductor 5, and the capacitance portion through conductor 5a. In this example, it is easy to lengthen a wiring length of electrical connection between the first electrode 6 and the second electrode 7 with no increase in external size of the insulating substrate 1. That is, the above-described electric connection is effective for achieving reduction in size and for achieving a wide bandwidth.

In the example illustrated in FIG. 1B, the first electrode 6 and the ground conductor 3 are electrically connected to each other by the first connection conductor 8. The first electrode 6 is directly electrically connected to the ground conductor 3 by the first connection conductor 8 not via the capacitance conductor 5 or the like. In this example, it is easy to lengthen a wiring length between the first electrode 6 and the second electrode 7. That is, the above-described electric connection is effective for achieving reduction in size and a high gain.

Therefore, according to the RFID tag board 10 in the present embodiment, it is possible to provide the small RFID tag which is good in reliability of connection with the semiconductor element 11 and with which it is easy to improve antenna properties of achieving a wide bandwidth or a high gain.

The insulating substrate 1 functions as an electrically insulating substrate for disposing the conductor portions such as the above-described antenna conductor with the conductor portions being electrically insulated from each other. The insulating substrate 1 also functions as a substrate for installing and fixing the semiconductor element 11.

The insulating substrate 1 has a flat plate-like quadrangular shape such as a square shape or a rectangular shape as in an example illustrated in FIGS. 2A to 3B, for example. The recess 1a is provided on a predetermined portion such as the central portion of the lower surface of the insulating substrate 1, for example. As described above, the semiconductor element 11 constituting the power supply unit is located in the recess 1a and the semiconductor element 11 is fixed to the bottom surface of the recess 1a.

The insulating substrate 1 is formed by using, for example, a ceramic sintered body such as an aluminum oxide sintered body, an aluminum nitride sintered body, a mullite sintered body or a glass ceramic sintered body. The insulating substrate 1 is obtained when a plurality of insulating layers 1b is laminated. In the example illustrated in FIGS. 1A and 1B, the insulating substrate 1 is configured of a laminate of three insulating layers 1b but the number of the insulating layers 1b is not limited to three. If the insulating substrate 1 is formed by using, for example, an aluminum oxide sintered body, the insulating substrate 1 can be prepared in the following manner. First, base powders of aluminum oxide, silicon oxide or the like are molded into a sheet shape with an appropriate organic binder and an organic solvent and a plurality of quadrangular sheet-shaped ceramic green sheets is prepared. Next, the ceramic green sheets are laminated and a laminate is prepared. Thereafter, the insulating substrate 1 can be prepared by firing the laminate under a temperature of 1300 to 1600° C.

When the firing is performed after a central portion or the like of a portion of the ceramic green sheets is punched in the thickness direction to process the ceramic green sheet into a frame-like shape and the frame-shaped ceramic green sheet is laminated such that the frame-shaped ceramic green sheet becomes the lowermost layer or the like, the insulating substrate 1 provided with the recess 1a can be prepared. The insulating substrate 1 is a laminate in which the plurality of insulating layers 1b, each of which is obtained when the ceramic green sheet is sintered, is laminated.

The conductor portions such as the upper surface conductor 2 or the like are portions constituting the inverted-F antenna in the RFID tag 20 that transmits and receives a radio wave to and from an antenna 32 of a reader/writer 31 which is described later.

The upper surface conductor 2 is the antenna conductor through which a radio wave is actually transmitted and received and, for example, the upper surface conductor 2 is formed by a conductor layer having a rectangular shape such as a square shape. The upper surface conductor 2 is a patch antenna and the power supply unit is electrically connected to an end portion (in an example illustrated in FIGS. 2A and 2B, an outer peripheral portion that is close to the center of one side of the upper surface conductor 2) of the rectangular antenna conductor via the short-circuit portion through conductor 4.

The first connection conductor 8, the ground conductor 3, the short-circuit portion through conductor 4, the upper surface conductor 2, and the second connection conductor 9 constitute an electrical connection path between the first electrode 6 and the second electrode 7. In the example of FIG. 1A, the capacitance conductor 5 and the capacitance portion through conductor 5a also constitute a portion of the path. Note that, in the example of FIG. 1B, the capacitance conductor 5 and the capacitance portion through conductor 5a are not included in the electrical connection path between the first electrode 6 and the second electrode 7. Among these, the ground conductor 3 is a portion that produces a ground potential to the antenna conductor including the upper surface conductor 2 and is electrically connected to the upper surface conductor 2 by the short-circuit portion through conductor 4. The short-circuit portion through conductor 4 is a portion having a function of supplying power to the upper surface conductor 2 as described above and is electrically connected to the power supply units including the first electrode 6.

The capacitance conductor 5 faces the upper surface conductor 2 with a portion of the insulating substrate 1 (the insulating layer 1b) interposed therebetween, is electrically connected to the ground conductor 3 via the capacitance portion through conductor 5a, and has a function of imparting a predetermined static capacitance to the antenna conductor. The capacitance conductor 5 extends toward a central portion from an end that is opposite to an end portion to which the short-circuit portion through conductor 4 is connected. The capacitance conductor 5 is electrically connected to the ground conductor 3 by the capacitance portion through conductor 5a at the end that is opposite to the end portion to which the short-circuit portion through conductor 4 is connected.

For example, since the upper surface conductor 2 that has a square shape or the like and has a relatively large area, the ground conductor 3 that faces the upper surface conductor 2 and has a relatively large area, and the capacitance conductor 5 that faces the upper surface conductor 2 are provided and the power supply units are electrically connected to the end portion of the upper surface conductor 2, it is possible to provide the RFID tag 20 with which it is easy to achieve reduction in size and a high gain as described above.

The facing area between the capacitance conductor 5 and the upper surface conductor 2 being large is advantageous in the viewpoint of achieving reduction in size. However, in the viewpoint of achieving a high gain, the facing area between the capacitance conductor 5 and the upper surface conductor 2 being small is favorable. In consideration of this point, and in consideration of the productivity as the RFID tag 20, economic efficiency, and the like, the capacitance conductor 5 and the upper surface conductor 2 may be set to face each other over a range of approximately 10 to 90% of the area of the upper surface conductor 2 as seen in plan view.

Each of the first electrode 6 and the second electrode 7 included in the power supply units also functions as a connection pad for electrically connecting the terminal of the semiconductor element 11. The first electrode 6 and the second electrode 7 are formed into patterns having a quadrangular shape such as a rectangular shape and facilitate connecting the bonding wires 13 through various bonding methods.

The first connection conductor 8 electrically connects the first electrode 6 and the capacitance conductor 5 or the ground conductor 3. In the example illustrated in FIG. 1A, the first connection conductor 8 is constituted of the first through conductor 8b penetrating the insulating layer 1b between the first electrode 6 and the capacitance conductor 5 and the first connection conductor 8 connects the first electrode 6 and the capacitance conductor 5. In the example illustrated in FIG. 1B, the first connection conductor 8 is constituted of the first internal wiring conductor 8a extending from the first electrode 6 to the inside of the insulating substrate 1 (between the insulating layers 1b) and the first through conductor 8b penetrating the insulating layer 1b between the first internal wiring conductor 8a and the ground conductor 3. The first connection conductor 8 connects the first electrode 6 and the ground conductor 3.

In the example illustrated in FIGS. 1A and 1B, the second connection conductor 9 is constituted of the second through conductor 9b penetrating the insulating layers 1b between the second electrode 7 and the upper surface conductor 2 and the second connection conductor 9 directly connects the second electrode 7 and the upper surface conductor 2. The second electrode 7 and the upper surface conductor 2 are electrically connected to each other via the second connection conductor 9 and as is described in detail later, the second electrode 7 and the upper surface conductor 2 may be electrically connected to each other by the second connection conductor 9 constituted of a second internal wiring conductor 9a and the second through conductor 9b or may be electrically connected to each other via the second connection conductor 9 and another conductor.

The conductor portions such as the upper surface conductor 2, the ground conductor 3, the short-circuit portion through conductor 4, the capacitance conductor 5, the capacitance portion through conductor 5a, the first electrode 6, the second electrode 7, the first connection conductor 8 (the first internal wiring conductor 8a and the first through conductor 8b), and the second connection conductor 9 (the second internal wiring conductor 9a and the second through conductor 9b) are formed of, for example, a metal material such as tungsten, molybdenum, manganese, copper, silver, palladium, gold, platinum, nickel, cobalt, or the like. These conductor portions may be formed of an alloy material including the above-described metal material. Such a metal material or the like is provided inside the insulating substrate 1 and on a surface as a metallized conductor.

In a metallized layer formed of tungsten, the above-described conductor portions can be formed by a method of printing a metallic paste, which is prepared by mixing tungsten powders, an organic solvent, and an organic binder, on predetermined positions on ceramic green sheets, which become the insulating substrate 1 (the insulating layers 1b), through a method such as a screen printing method and firing the ceramic green sheets at the same time thereafter.

A portion such as the short-circuit portion through conductor 4 that penetrates the insulating substrate 1 (the insulating layers 1b) in the thickness direction can be formed by providing through holes in the ceramic green sheets in advance and firing the ceramic green sheets after filling the through holes with the same metallic paste as described above. The through holes can be provided in the ceramic green sheets by a method such as mechanical drilling or laser processing.

When such a conductor portion is a metalized layer and is formed on a surface (including the bottom surface of the recess 1a) of the insulating substrate 1, an exposed surface of the metalized layer may be coated with a nickel plating layer, a gold plating layer, and the like such that oxidation corrosion is suppressed and bonding properties of the bonding wires 13 are improved.

As described above, in the RFID tag 20, the semiconductor element 11 is installed in the recess 1a of the RFID tag board 10 as described above and the first electrode 6 and the second electrode 7 are electrically connected to the terminals (with no reference numeral) of the semiconductor element 11. Since the RFID tag board 10 as described above is used, the RFID tag 20 is small, is good in reliability of connection with the semiconductor element 11, and is good in antenna properties of achieving a wide bandwidth or a high gain.

The semiconductor element 11 functions as a portion of the power supply units described above and also has an information management function such as storing and retrieving a signal transmitted and received between the RFID tag 20 and an external device. The semiconductor element 11 is fixed to the bottom surface of the recess 1a. The semiconductor element 11 is fixed to the bottom surface of the recess 1a by, for example, a bonding method in which the semiconductor element 11 is fixed via a low melting point brazing material such as gold-silicon wax, a bonding material such as a glass composite material or a resin adhesive. In the example illustrated in FIGS. 1A and 1B, the terminals (with no reference numerals) of the semiconductor element 11 are electrically connected to the first electrode 6 and the second electrode 7 via the bonding wires 13. The electrical connection between the terminals of the semiconductor element 11 and the first electrode 6 and the second electrode 7 is not limited to this and may be achieved through flip-chip connection using a solder ball, a bump made of metal such as gold, or the like, for example.

The sealing resin 12 is a portion that covers the semiconductor element 11 to protect the semiconductor element 11 from moisture in the outside air or the outside air such as oxygen, an external mechanical stress, and the like. Examples of resin materials used to form the sealing resin 12 include epoxy resin, polyimide resin, silicone resin, and the like. Filler particles such as silica particles or glass particles may be added to these resin materials. The filler particles are added to adjust various characteristics of the sealing resin 12 such as a mechanical strength, moisture resistance, or electrical characteristics. A material for the sealing resin 12 can be selected from those various resin materials and used according to a condition such as workability (productivity) at the time of producing the RFID tag 20 and economic efficiency.

The RFID tag 20 as described above is used by being mounted on an article in an RFID system 30 which is described later.

An article 40 on which the RFID tag 20 is mounted is various articles of which a use history is needed when being used. For example, examples of the article 40 include tools such as a jig or an industrial tool which is used in various types of industrial processing such as mechanical processing, metal processing, and resin processing. These tools include consumable tools which are cut, polished, or the like. The purpose of the article 40 is not limited to an industrial purpose and examples of the article 40 also include daily necessities for home use, agricultural products, various prepaid cards for transport facilities, and medical instruments.

When mounting the RFID tag 20 to the article 40, it is effective to ground the ground conductor 3 to a metal portion of the article 40. When the RFID tag 20 is mounted in this manner, the metal portion of the article serves as a ground conductor of an antenna (the above-described inverted-F antenna or the like) of the RFID tag 20, the gain of the antenna is improved, and the communication range of the RFID tag 20 is expanded.

(RFID System)

As described above, the RFID system 30 according to the embodiment as illustrated in FIG. 4 is configured to include the RFID tag 20 configured as described above. The RFID system 30 according to the embodiment includes the RFID tag 20 configured as described above and the reader/writer 31 including the antenna 32 that transmits and receives a radio wave to and from the upper surface conductor 2 of the RFID tag 20. The reader/writer 31 is formed such that the rectangular antenna 32 is provided on a substrate 33 which is formed of, for example, electrically an insulating material. The substrate 33 may be a housing (not shown) that accommodates the antenna 32. Note that, in FIG. 4, the sealing resin 12 is omitted for simplicity. The sealing resin 12 may also be omitted in the following drawings.

The RFID tag 20 is used by being mounted on various articles 40 and various pieces of information about the article 40 is written in the semiconductor element 11. The information can be rewritten at any time according to information that is transmitted and received between the reader/writer 31 and the RFID tag 20 in the RFID system 30 including the RFID tag 20. In this manner, various pieces of information about the article 40 is updated at any time.

In an example illustrated in FIG. 4, the RFID tag 20 is used while being substantially inverted unlike the example illustrated in FIGS. 1A and 1B and being close to the reader/writer 31. For example, a radio wave emitted from the antenna 32 of the reader/writer 31 is received by the upper surface conductor 2 of the RFID tag 20 and is transmitted to the semiconductor element 11 via the above-described conductor portions, as an electrical signal.

Note that, the upper surface conductor 2 of the RFID tag 20 and the antenna 32 of the reader/writer 31 do not necessarily face each other in a state as illustrated in, for example, FIG. 4 and any configuration may be adopted as long as a positional relationship can be achieved in which transmission and reception of a radio wave therebetween can be performed. For example, a plurality of articles (not shown) may overlap each other and one article and the reader/writer 31 may be disposed with another article present therebetween.

Figure 5A:
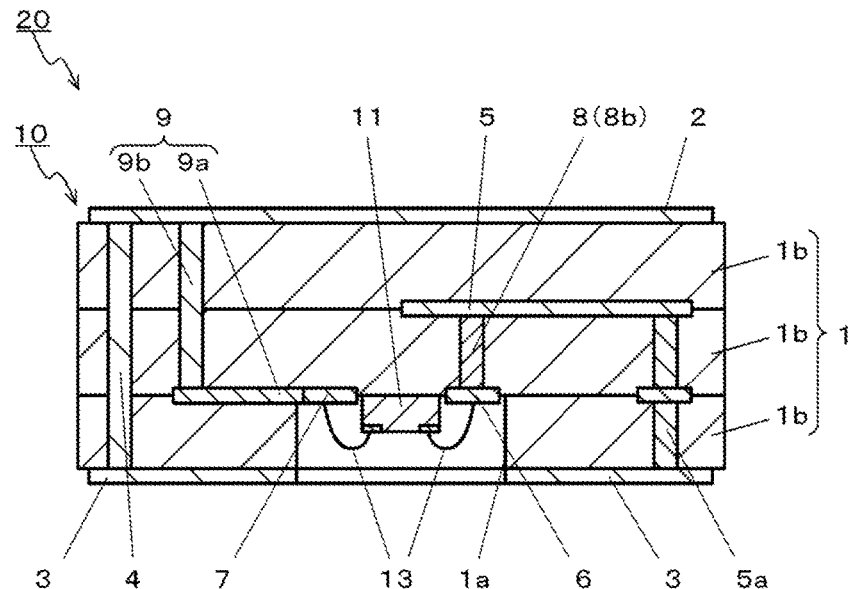
FIGS. 5A and 5B are sectional views illustrating another example of the RFID tag according to the first embodiment.
Figure 5B:
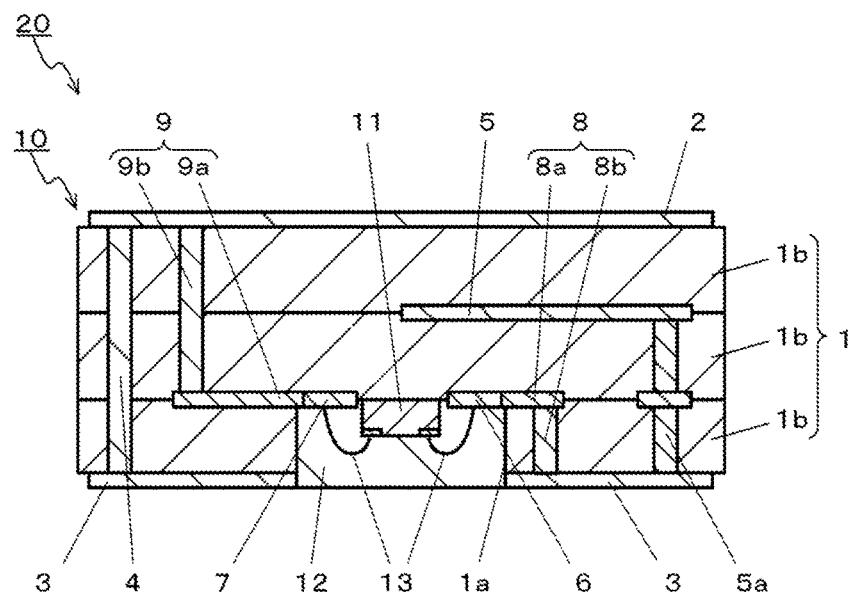

Both of FIGS. 5A and 5B are sectional views illustrating another example of the RFID tag according to the first embodiment. The way in which the second electrode 7 and the upper surface conductor 2 are electrically connected to each other in the RFID tag board 10 in an example illustrated in FIGS. 5A and 5B is different from that of the RFID tag board 10 in the example illustrated in FIGS. 1A and 1B. Specifically, the RFID tag board 10 in the example illustrated in FIGS. 5A and 5B and the RFID tag board 10 in the example illustrated in FIGS. 1A and 1B are the same as each other in that the second electrode 7 and the upper surface conductor 2 are connected by the second connection conductor 9 but are different from each other in configuration of the second connection conductor 9. Except for this point, FIG. 5A and FIG. 1A are the same as each other and FIG.

5B and FIG. 1B are the same as each other. Portions in FIGS. 5A and 5B that are the same as those in FIGS. 1A and 1B are given the same reference numerals.

In the example illustrated in FIGS. 5A and 5B, the second internal wiring conductor 9a is provided from the second electrode 7 to the inside of the insulating substrate 1 (between the insulating layers 1b). The second internal wiring conductor 9a is electrically connected to the upper surface conductor 2 by the second through conductor 9b extending from the second internal wiring conductor 9a to the upper surface of the insulating substrate 1. That is, in the example illustrated in FIGS. 5A and 5B, the second connection conductor 9 is constituted of the second internal wiring conductor 9a and the second through conductor 9b. Note that, the second electrode 7 may be regarded as a portion of the second internal wiring conductor 9a. The second internal wiring conductor 9a does not need to be formed into one linear conductor having the same width as the second electrode 7 and, for example, the second internal wiring conductor 9a may have a portion with a width larger than that of the second electrode 7 and may have an angled portion as seen in plan view. If the first connection conductor 8 is connected to the ground conductor 3 and the wiring length between the first electrode 6 and the second electrode 7 is shortened as in an example illustrated in FIG. 5B, the second internal wiring conductor 9a may have a linear shape that extends up to a connection portion between the second internal wiring conductor 9a and the second through conductor 9b. On the contrary, if the first connection conductor 8 is connected to the capacitance conductor 5 and the wiring length between the first electrode 6 and the second electrode 7 is lengthened as in an example illustrated in FIG. 5A, the second internal wiring conductor 9a may have a curved shape, for example, a meander shape.

If the first electrode 6 is electrically connected to the capacitance conductor 5 by the first connection conductor 8, the RFID tag board 10 can have a configuration in which the second electrode 7 is directly electrically connected to the upper surface conductor 2 by the second connection conductor 9 as in the examples illustrated in FIGS. 1A, 2, and 5A. Electrical connection from the first electrode 6 to the second electrode 7 is established in the following order: the first electrode 6, the first connection conductor 8, the capacitance conductor 5, the capacitance portion through conductor 5a, the ground conductor 3, the short-circuit portion through conductor 4, the upper surface conductor 2, and the second connection conductor 9. Therefore, the path is long. Therefore, a transmission loss in the path becomes large and the Q-value in a transmission line becomes low. When the Q-value in the transmission line becomes low, a bandwidth for a frequency becomes wide.

Accordingly, in the RFID tag board 10, it is possible to effectively widen the frequency band of a radio wave that is effectively transmitted and received by the upper surface conductor 2. The RFID tag 20 using such a RFID tag board 10 can be the RFID tag 20 with which it is easy to widen the frequency band of a radio wave transmitted and received in the upper surface conductor 2 and which corresponds to a plurality of RFID systems 30 that uses radio waves in different frequency bands. That is, when one RFID tag 20 is attached to the article 40, it is possible to manage information on the article 40 corresponding to the plurality of RFID systems 30 that transmits and receives radio waves in different frequency bands, for example. In other words, it is not necessary to attach a plurality of RFID tags 20, which corresponds to different frequency bands, to the article 40 and the practicality as the RFID system 30 is improved.

Second Embodiment

Figure 6:
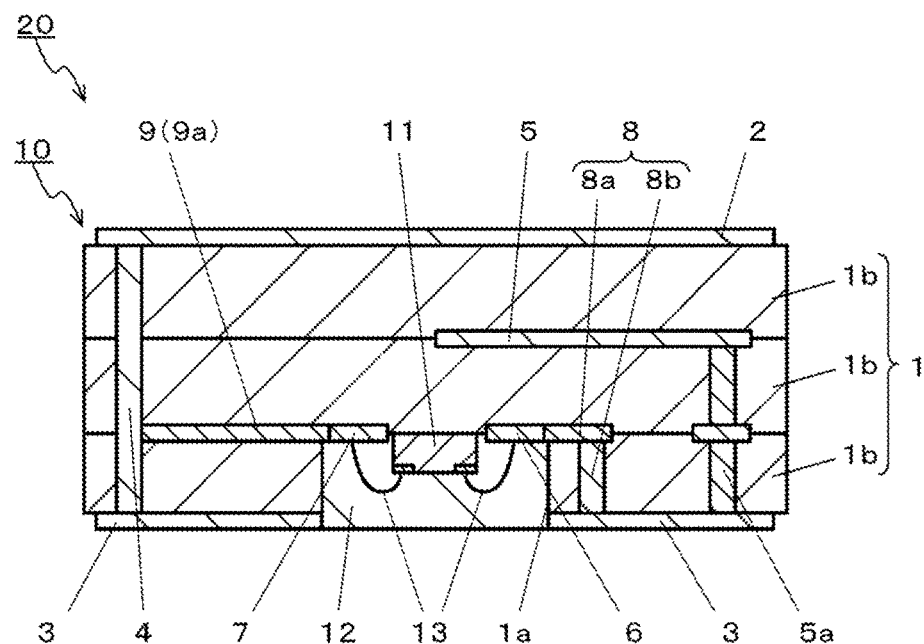
FIG. 6 is a sectional view illustrating an example of an RFID tag according to a second embodiment.

FIG. 6 is a sectional view illustrating a second embodiment of the RFID tag 20 according to the embodiment of the disclosure. An example illustrated in FIG. 6 is an example in which the RFID tag board 10, of which the first electrode 6 is electrically connected to the ground conductor 3 by the first connection conductor 8, is used. Portions in FIG. 6 that are the same as those in FIGS. 1A and 1B are given the same reference numerals. The way in which the second electrode 7 and the upper surface conductor 2 are electrically connected to each other in the second embodiment is different from that in the first embodiment. In the RFID tag board 10 according to the first embodiment, the second electrode 7 is directly electrically connected to the upper surface conductor 2 by the second connection conductor 9. However, in the RFID tag board 10 according to the second embodiment, the second electrode 7 and the upper surface conductor 2 are electrically connected to each other by the second connection conductor 9 and the short-circuit portion through conductor 4. As in the example illustrated in FIG. 6, the second electrode 7 is connected to the short-circuit portion through conductor 4 by the second connection conductor 9 (the second internal wiring conductor 9a), the short-circuit portion through conductor 4 being electrically connected to the upper surface conductor 2. The second connection conductor 9 is the second internal wiring conductor 9a that extends from the second electrode 7 to the short-circuit portion through conductor 4 inside the insulating substrate 1 (between the insulating layers 1b).

In the RFID tag board 10 in the example illustrated in FIG. 6, an electrical connection path from the first electrode 6 and the second electrode 7 is established in the following order: the first electrode 6, the first connection conductor 8 (the first internal wiring conductor 8a and the first through conductor 8b), the ground conductor 3, the short-circuit portion through conductor 4 (a lower surface side portion), and the second connection conductor 9 (the second internal wiring conductor 9a). That is, the path is shorter than that in the examples illustrated in FIGS. 1B and 5B. Therefore, a transmission loss in the path becomes further smaller, and thus the gain of the RFID tag board 10 and the RFID tag 20 becomes high.

It is easy to make the gain of a radio wave transmitted and received in the upper surface conductor 2 high and, for example, it is possible to lengthen a communication range between the RFID tag 20 and a reader/writer in the RFID system 30. The above-described configuration is also advantageous in the viewpoint of increasing the precision of detected information. That is, when one RFID tag 20 is attached to the article 40, it is possible to transmit and receive information on an article with each in a state where the article 40 and the reader/writer 31 are somewhat separated from each other. Therefore, it is possible to manage information on the article 40 at a high precision and a high speed without bringing the article 40 close to the reader/writer 31 one by one.

Third Embodiment

Figure 7:
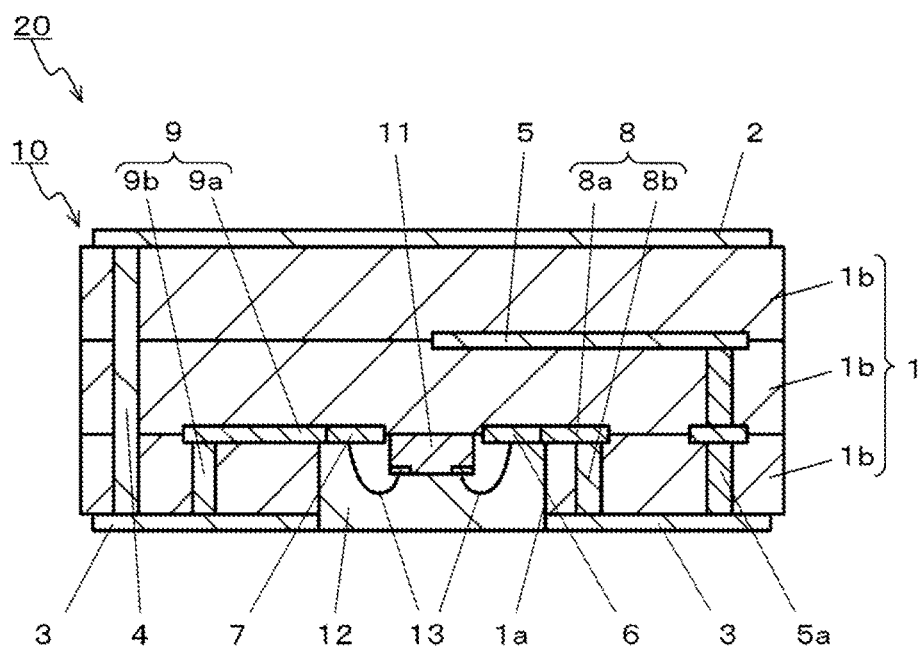
FIG. 7 is a sectional view illustrating an example of an RFID tag according to a third embodiment.

FIG. 7 is a sectional view illustrating a third embodiment of the RFID tag 20 according to the embodiment of the disclosure. An example illustrated in FIG. 7 is an example in which the RFID tag board 10, of which the first electrode 6 is electrically connected to the ground conductor 3 by the first connection conductor 8, is used. Portions in FIG. 7 that are the same as those in FIGS. 1A and 1B are given the same reference numerals. The way in which the second electrode 7 and the upper surface conductor 2 are electrically connected to each other in the third embodiment is different from that in the first embodiment. In the RFID tag board 10 according to the first embodiment, the second electrode 7 is directly electrically connected to the upper surface conductor 2 by the second connection conductor 9. However, in the RFID tag board 10 according to the third embodiment, the second electrode 7 and the upper surface conductor 2 are electrically connected to each other by the second connection conductor 9, the ground conductor 3, and the short-circuit portion through conductor 4. As in the example illustrated in FIG. 7, the second electrode 7 is connected to the ground conductor 3 by the second connection conductor 9 (the second internal wiring conductor 9a and the second through conductor 9b), the ground conductor 3 being electrically connected to the upper surface conductor 2. The second connection conductor 9 is constituted of the second internal wiring conductor 9a extending from the second electrode 7 to the inside of the insulating substrate 1 along the ground conductor 3 and the second through conductor 9b extending from the second internal wiring conductor 9a to the ground conductor 3.

In the RFID tag board 10 in the example illustrated in FIG. 7, an electrical connection path from the first electrode 6 and the second electrode 7 is established in the following order: the first electrode 6, the first connection conductor 8 (the first internal wiring conductor 8a and the first through conductor 8b), the ground conductor 3, and the second connection conductor 9 (the second through conductor 9b and the second internal wiring conductor 9a). That is, the wiring length of the connection path is shorter than that in the examples illustrated in FIGS. 1B, 5B and 6. Therefore, a transmission loss in the path is further reduced, and thus the gain of the RFID tag board 10 and the RFID tag 20 becomes high more effectively. It can be said that the RFID tag board 10 and the RFID tag 20 in the example illustrated in FIG. 7 are effective when focusing on effectively achieving a high-gain antenna conductor.

That is, the RFID tags 20 in the examples illustrated in FIGS. 1A, 1B, 5A, 5B, 6, and 7 have a configuration made focusing on an effect of achieving a high gain more than an effect of achieving a wide bandwidth, in the following order. When the RFID system 30 as illustrated in FIG. 4 is actually prepared by using an RFID tag, the RFID tag 20 having a configuration suitable for the RFID system 30 may be used.

(Simulation Example)

Figure 8A:
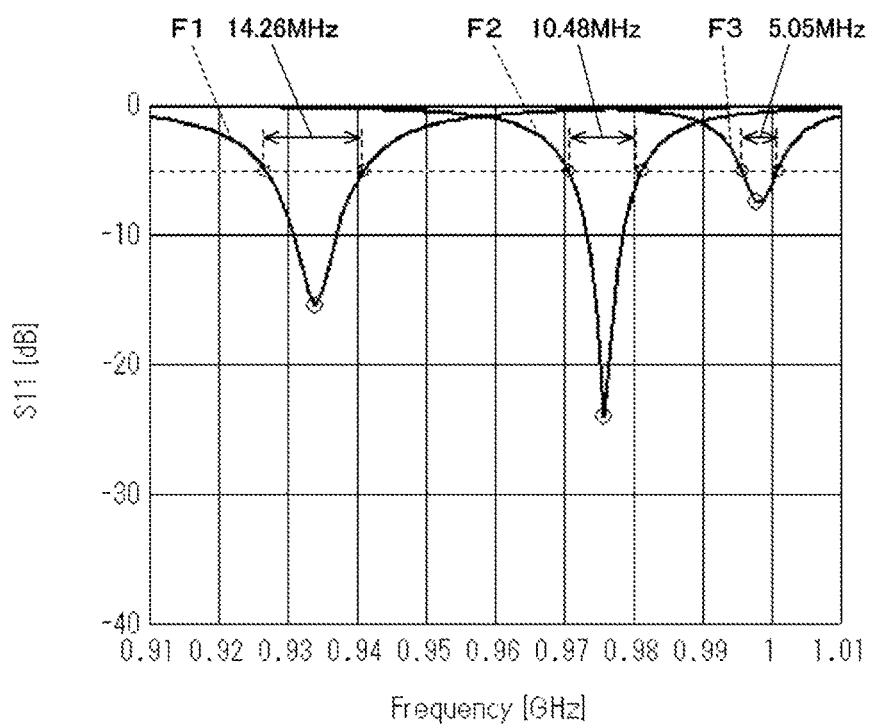
FIG. 8A illustrates bandwidths of the RFID tags illustrated in FIGS. 5A, 5B, and 7
Figure 8B:
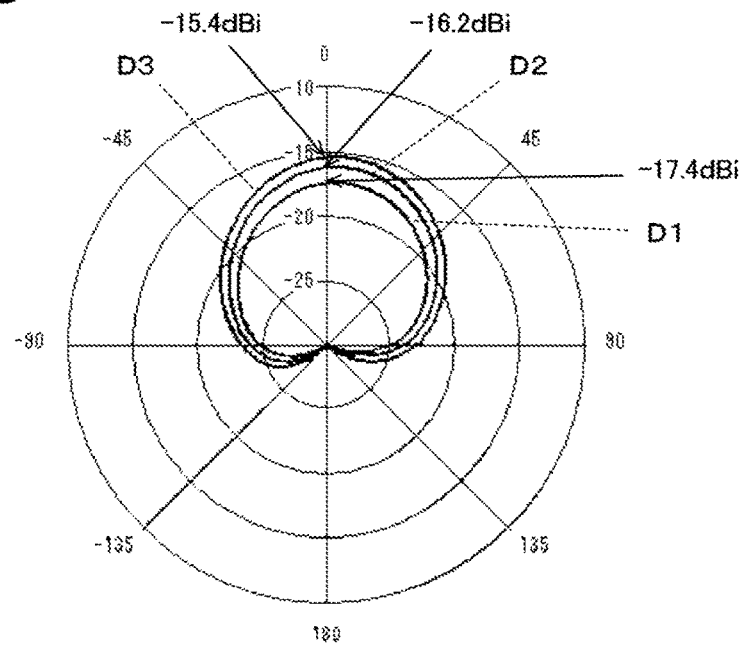
FIG. 8B illustrates antenna gains thereof.

FIGS. 8A and 8B respectively illustrate the reflection characteristic and the emission characteristic of each of the RFID tags 20 (the RFID tag boards 10) illustrated in FIGS. 5A, 5B, and 7, the reflection characteristic and the emission characteristic being obtained by an electromagnetic field simulation. In FIG. 8A, the horizontal axis of the graph represents a frequency, the vertical axis represents a reflection characteristic S11, and each of arrows represents a bandwidth with S11 of −5 dB or less. In FIG. 8B, the vertical axis of the graph represents an antenna gain, each of values around the graph represents an angle with respect to a zenithal direction as 0° (for example, an upward direction in FIGS. 5A and 5B) and each of values pointed by arrows represents an antenna gain at 0°.

In the graph in FIG. 8A that illustrates the reflection characteristic, F1 represents the reflection characteristic of the RFID tag 20 illustrated in FIG. 5A, F2 represents the reflection characteristic of the RFID tag 20 illustrated in FIG. 5B, and F3 represents the reflection characteristic of the RFID tag 20 illustrated in FIG. 7. The bandwidth of F1 is 14.26 MHz, the bandwidth of F2 is 10.48 MHz, and the bandwidth of F3 is 5.05 MHz. A bandwidth F1 of the RFID tag 20 (the RFID tag board 10) in the example illustrated in FIG. 5A in which the first electrode 6 is electrically connected to the capacitance conductor 5 is wider than that of the examples illustrated in FIGS. 5B and 7 in which the first electrode 6 is electrically connected to the ground conductor 3.

In the graph in FIG. 8B that illustrates the emission characteristic, D1 represents the emission characteristic of the RFID tag 20 illustrated in FIG. 5A, D2 represents the emission characteristic of the RFID tag 20 illustrated in FIG. 5B, and D3 represents the emission characteristic of the RFID tag 20 illustrated in FIG. 7. The antenna gain of D1 is −17.4 dBi, the antenna gain of D2 is −16.2 dBi, and the antenna gain of D3 is −15.4 dBi. An antenna gain D2 in the example illustrated in FIG. 5B in which the first electrode 6 is electrically connected to the ground conductor 3 and an antenna gain D3 in the example illustrated in FIG. 7 are higher than an antenna gain D1 of the RFID tag 20 (the RFID tag board 10 in the example illustrated in FIG. 5A in which the first electrode 6 is electrically connected to the capacitance conductor 5. Furthermore, the antenna gain D3 in the example illustrated in FIG. 7 in which a connection path from the first electrode 6 to the second electrode 7 is short is higher than the antenna gain D2 in the example illustrated in FIG. 5B.

That is, a bandwidth is wide in the RFID tag 20 in FIG. 5A in which the first electrode 6 is electrically connected to the capacitance conductor 5 and a connection path from the first electrode 6 to the second electrode 7 is long. Meanwhile, the gain of the RFID tags 20 in FIGS. 5B and 7, in which the first electrode 6 is electrically connected to the ground conductor 3 and a connection path from the first electrode 6 to the second electrode 7 is shorter than that in FIG. 5A, is high. The gain of the RFID tag 20 in FIG. 7 in which the second electrode 7 is electrically connected to the ground conductor 3 by the second connection conductor 9 is higher than the gain of the RFID tag 20 in FIG. 5B in which the second electrode 7 is electrically connected to the short-circuit portion through conductor 4 by the second connection conductor 9.

Note that, when the result of the simulation is obtained, the only difference between FIG. 5A and FIG. 5B is whether the first connection conductor 8 is connected to the capacitance conductor 5 or to the ground conductor 3. The only difference between FIG. 5B and FIG. 7 is whether the second through conductor 9b is connected to the short-circuit portion through conductor 4 or to the ground conductor 3. Other configurations and materials are the same as each other.

Fourth Embodiment

Figure 9A:
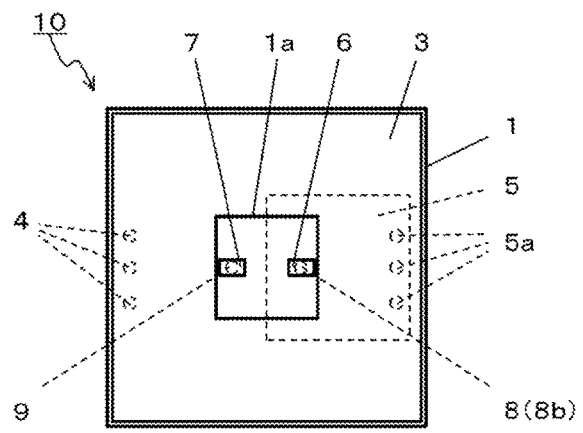
FIGS. 9A and 9B illustrate an example of an RFID tag according to a fourth embodiment, where
Figure 9B:
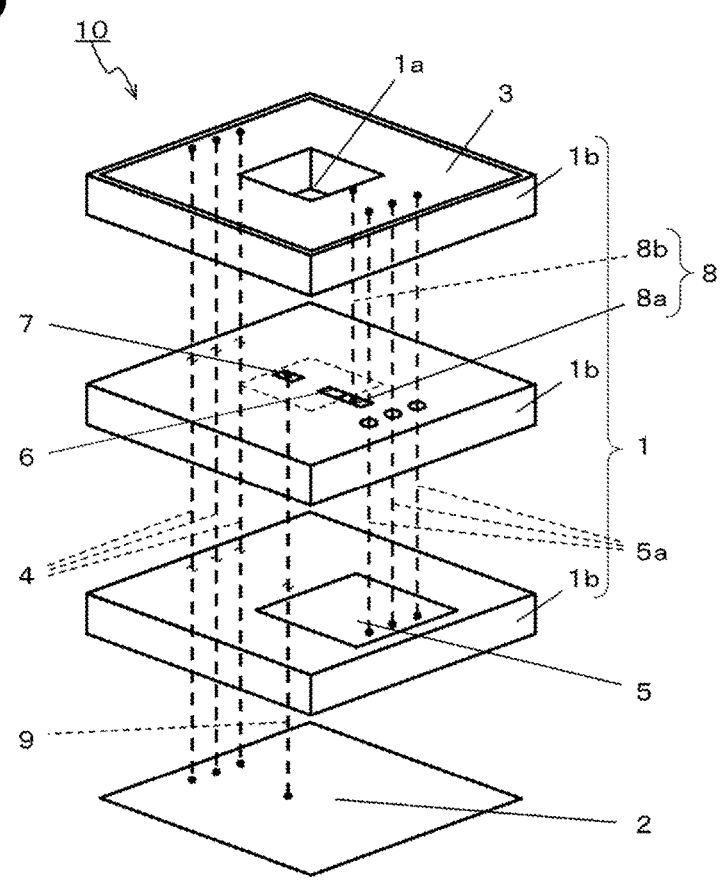

FIGS. 9A and 9B illustrate an example of the RFID tag 20 according to a fourth embodiment, FIG. 9A is a bottom view, and FIG. 9B is an exploded perspective view of FIG. 9A. Note that, FIGS. 9A and 9B illustrate only the RFID tag board 10 in the RFID tag 20 with the semiconductor element 11 or the like being omitted for simplicity. Portions in FIGS. 9A and 9B that are the same as those in FIGS. 1A and 1B are given the same reference numerals. The fourth embodiment is different from the first to third embodiments in the number of short-circuit portion through conductors 4 and the number of capacitance portion through conductors 5a. In an example illustrated in FIGS. 9A and 9B, the upper surface conductor 2 and the ground conductor 3 are electrically connected by a plurality of (three) short-circuit portion through conductors 4. The capacitance conductor 5 and the ground conductor 3 are electrically connected by a plurality of (three) capacitance portion through conductors 5a.

Since the plurality of capacitance portion through conductors 5a and the plurality of short-circuit portion through conductors 4 constitute an electrical connection path from the first electrode 6 to the second electrode 7, it is possible to increase the Q-value of the path and to reduce a loss in comparison with a single capacitance portion through conductor 5a and a single short-circuit portion through conductor 4 being provided. Therefore, it is possible to provide the RFID tag 20 which is effective for more effectively achieving a high gain and for achieving a wide bandwidth.

In the example illustrated in FIGS. 9A and 9B, the plurality of short-circuit portion through conductors 4 and the plurality of capacitance portion through conductors 5a are provided. However, all of a configuration in which a plurality of short-circuit portion through conductors 4 and a single capacitance portion through conductor 5a are provided, a configuration in which a single short-circuit portion through conductor 4 and a plurality of capacitance portion through conductors 5a are provided, and a configuration in which a plurality of short-circuit portion through conductors 4 and a plurality of capacitance portion through conductors 5a are provided are effective for achieving a high gain. The configuration in which a plurality of short-circuit portion through conductors 4 and a plurality of capacitance portion through conductors 5a are provided is more effective. In the example illustrated in FIGS. 9A and 9B, the number of short-circuit portion through conductors 4 is three and the number of capacitance portion through conductors 5a is three. However, the number is not limited to this. The number of short-circuit portion through conductors 4 and the number of capacitance portion through conductors 5a may be different from each other. Regardless of the number of short-circuit portion through conductors 4 and the number of capacitance portion through conductors 5a, as in the example illustrated in FIGS. 9A and 9B, the short-circuit portion through conductors 4 and the capacitance portion through conductors 5a are arranged along sides of the ground conductor 3 that face each other, respectively.

(Simulation Example)

Figure 10A:
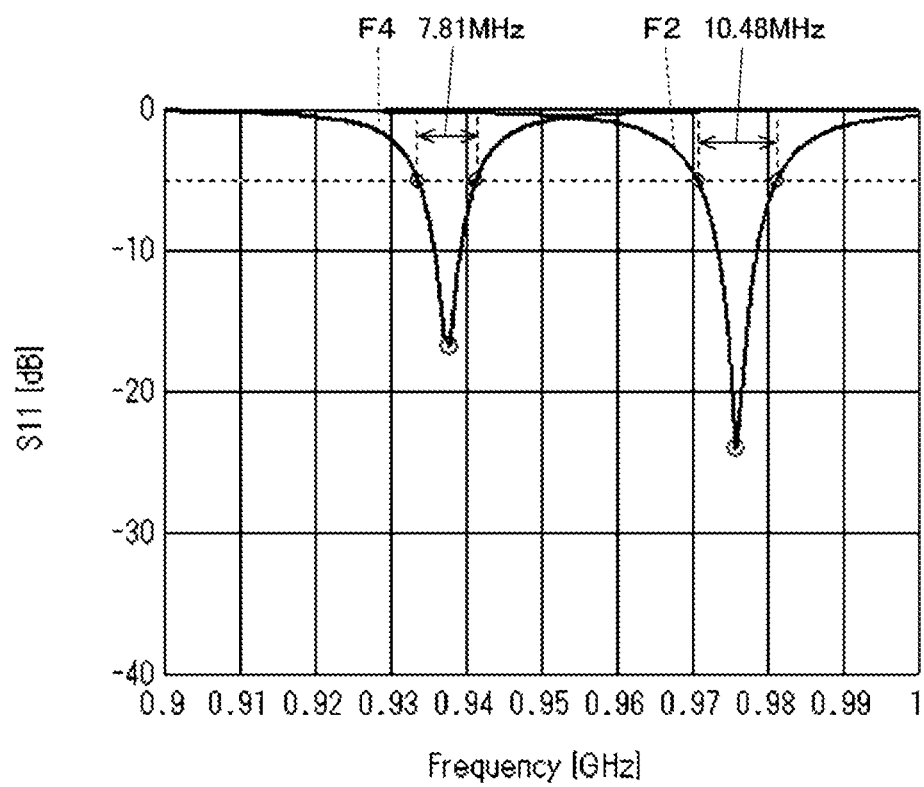
FIG. 10A illustrates bandwidths of the RFID tags illustrated in FIGS. 5B and 9 and FIG. 10B illustrates antenna gains thereof.
Figure 10B:
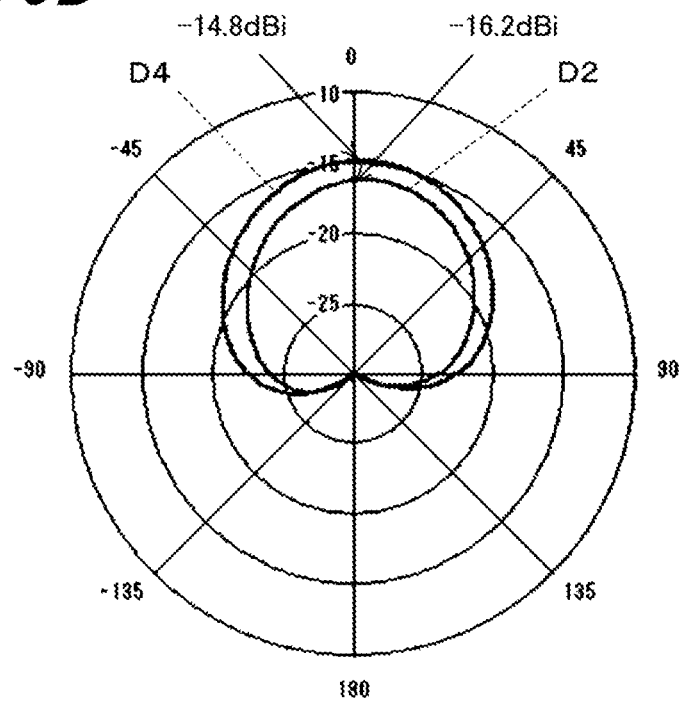

FIGS. 10A and 10B respectively illustrate the reflection characteristic and the emission characteristic of each of the RFID tags 20 (the RFID tag boards 10) illustrated in FIGS. 5B, 9A and 9B, the reflection characteristic and the emission characteristic being obtained by an electromagnetic field simulation. In FIG. 10A, the horizontal axis of the graph represents a frequency, the vertical axis represents a reflection characteristic S11, and each of arrows represents a bandwidth with S11 of −5 dB or less. In FIG. 10B, the vertical axis of the graph represents an antenna gain, each of values around the graph represents an angle with respect to a zenithal direction as 0° (for example, an upward direction in FIGS. 5A and 5B) and each of values pointed by arrows represents an antenna gain at 0°.

In the graph in FIG. 10A that illustrates the reflection characteristic, F2 represents the reflection characteristic of the RFID tag 20 illustrated in FIG. 5B and F4 represents the reflection characteristic of the RFID tag 20 illustrated in FIGS. 9A and 9B. The bandwidth of F2 is 10.48 MHz and the bandwidth of F4 is 7.81 MHz. A bandwidth F2 of the RFID tag 20 (the RFID tag board 10) in the example illustrated in FIG. 5B in which the number of short-circuit portion through conductors 4 and the number of capacitance portion through conductors 5a are small is wider than a bandwidth F4 of the RFID tag 20 (the RFID tag board 10) in the example illustrated in FIGS. 9A and 9B in which the number of short-circuit portion through conductors 4 and the number of capacitance portion through conductors 5a are large.

In the graph in FIG. 10B that illustrates the emission characteristic, D2 represents the emission characteristic of the RFID tag 20 illustrated in FIG. 5B and D4 represents the emission characteristic of the RFID tag 20 illustrated in FIGS. 9A and 9B. The antenna gain of D2 is −16.2 dBi and the antenna gain of D4 is −14.8 dBi. D4 of the RFID tag 20 (the RFID tag board 10) in the example illustrated in FIGS. 9A and 9B, in which the number of short-circuit portion through conductors 4 and the number of capacitance portion through conductors 5a are large, is a higher gain.

That is, a bandwidth is wide in the RFID tag 20 in FIG. 5B in which the number of short-circuit portion through conductors 4 and the number of capacitance portion through conductors 5a are small and the gain of the RFID tag 20 in FIGS. 9A and 9B, in which the number of short-circuit portion through conductors 4 and the number of capacitance portion through conductors 5a are larger than those in FIG. 5B, is high.

Note that, when the result of the simulation is obtained, the only difference between FIGS. 5B and 9 is the number of short-circuit portion through conductors 4 and the number of capacitance portion through conductors 5a and other configurations and materials are the same as each other.

Fifth Embodiment

Figure 11:
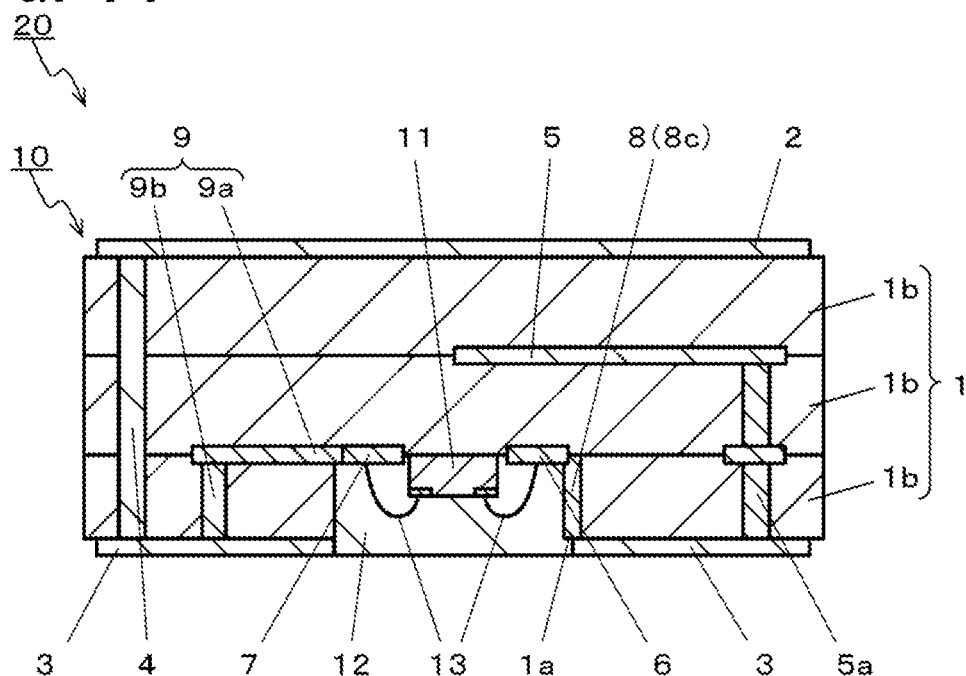
FIG. 11 is a sectional view illustrating an example of an RFID tag according to a fifth embodiment.

FIG. 11 is a sectional view illustrating a fifth embodiment of the RFID tag 20. The way in which the first electrode 6 and the ground conductor 3 are electrically connected to each other in the fifth embodiment is different from that in the first to fourth embodiments. In the RFID tag board 10 according to the first embodiment, the first connection conductor 8 is constituted of the first internal wiring conductor 8a and the first through conductor 8b. However, in the RFID tag board 10 according to the fourth embodiment, the first connection conductor 8 is constituted of a recess side-surface conductor 8c. An example illustrated in FIG. 11 is the same as the example illustrated in FIG. 7 except that the first connection conductor 8 (the first internal wiring conductor 8a and the first through conductor 8b) is changed to the recess side-surface conductor 8c. Portions in FIG. 11 that are the same as those in FIG. 7 are given the same reference numerals.

If the first electrode 6 is electrically connected to the ground conductor 3 by the recess side-surface conductor 8c as described above, the volume of a space for the conductor portions in the insulating substrate 1 or the like is reduced. Therefore, the above-described configuration is advantageous in the viewpoint of achieving reduction in size of the RFID tag 20. Since it is possible to shorten a wiring length from the first electrode 6 to the second electrode 7 in comparison with the first connection conductor 8 being constituted of the first internal wiring conductor 8a and the first through conductor 8b, the first electrode 6 being electrically to the ground conductor 3 by the recess-side surface conductor 8c is also advantageous in the viewpoint of achieving a high gain.

Sixth Embodiment

Figure 12:
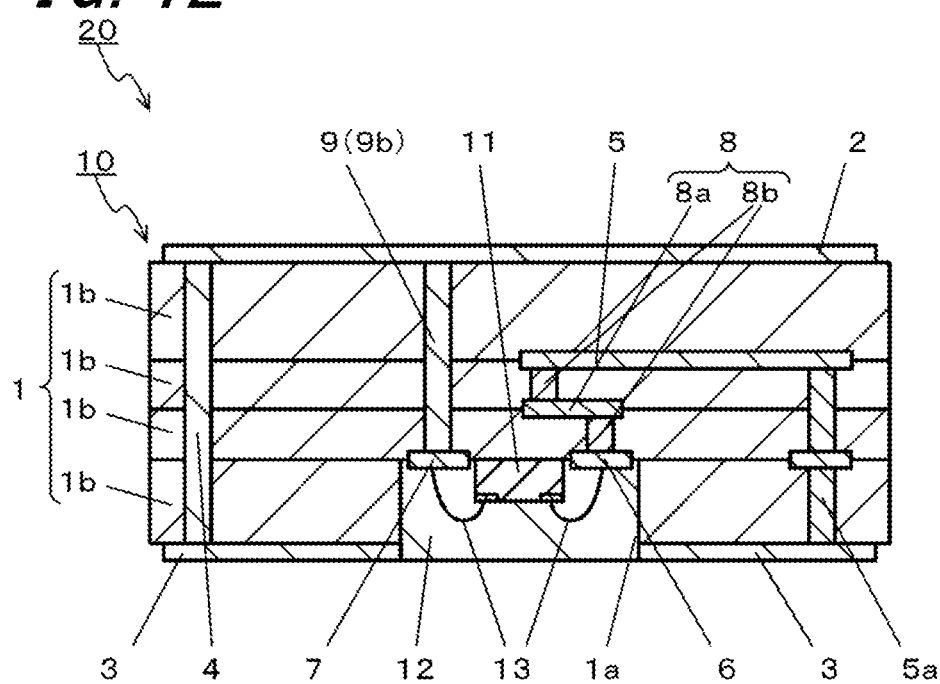
FIG. 12 is a sectional view illustrating an example of an RFID tag according to a sixth embodiment.

FIG. 12 is a sectional view illustrating a sixth embodiment of the RFID tag 20. The way in which the first electrode 6 and the capacitance conductor 5 are electrically connected to each other in the sixth embodiment is different from that in the first embodiment. In the RFID tag board 10 according to the first embodiment, the first connection conductor 8 is constituted of the first through conductor 8b. However, in the RFID tag board 10 according to the sixth embodiment, the first connection conductor 8 is constituted of the first internal wiring conductor 8a and two first through conductors 8b. An example illustrated in FIG. 12 is the same as the example illustrated in FIG. 1A except that the first connection conductor 8 constituted of the first through conductor 8b is changed to the first connection conductor 8 constituted of the first internal wiring conductor 8a and the first through conductors 8b. Portions in FIG. 12 that are the same as those in FIGS. 1A and 1B are given the same reference numerals.

In the example illustrated in FIG. 12, the first connection conductor 8 is connected to an end portion of the capacitance conductor 5 that is opposite to an end portion to which the capacitance portion through conductor 5a is connected. Therefore, in a sectional view as illustrated in FIG. 12, the first connection conductor 8 constituted of the first internal wiring conductor 8a and the two first through conductors 8b has a curved shape. In this example, it is possible to further lengthen a wiring length from the first electrode 6 to the second electrode 7 in comparison with the example illustrated in FIG. 1A, and thus the above-described configuration is advantageous in the viewpoint of achieving a wide bandwidth. It is also possible to further lengthen the wiring length from the first electrode 6 to the second electrode 7 with the first internal wiring conductor 8a having a curved shape that is curved as seen in plan view, for example, a meander shape.

Seventh Embodiment

Figure 13A:
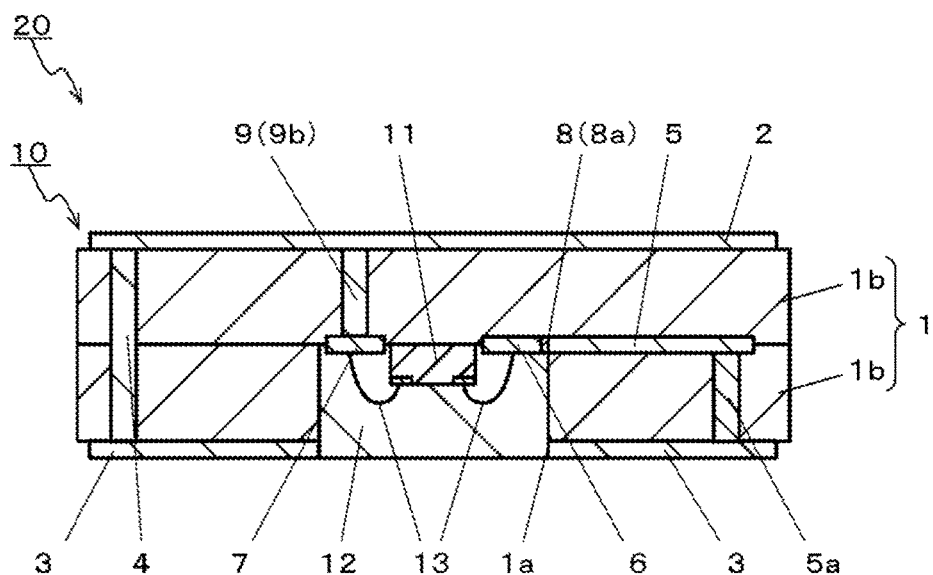
FIGS. 13A and 13B illustrate an example of an RFID tag according to a seventh embodiment, where
Figure 13B:
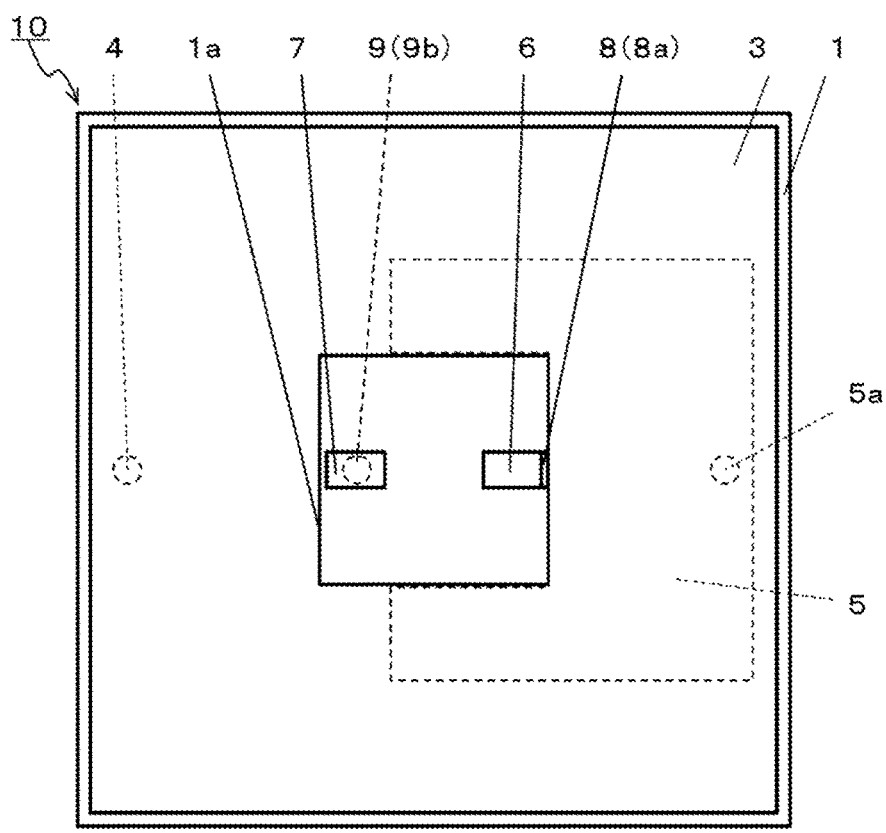
Figure 14A:
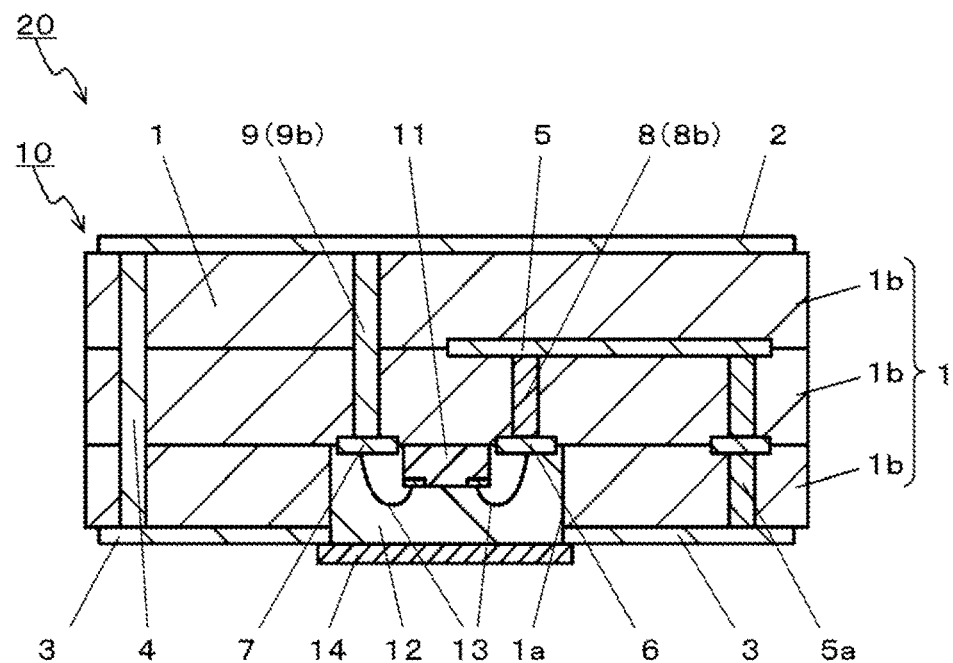
FIGS. 14A and 14B illustrate an example of an RFID tag according to an eighth embodiment, where
Figure 14B:
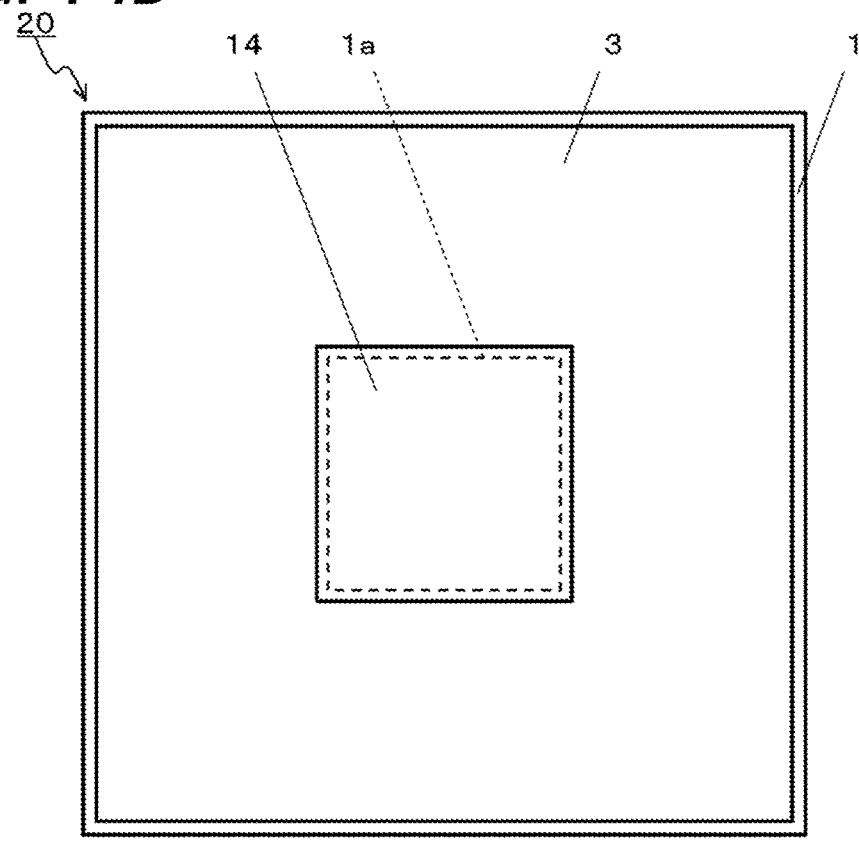
Figure 15A:
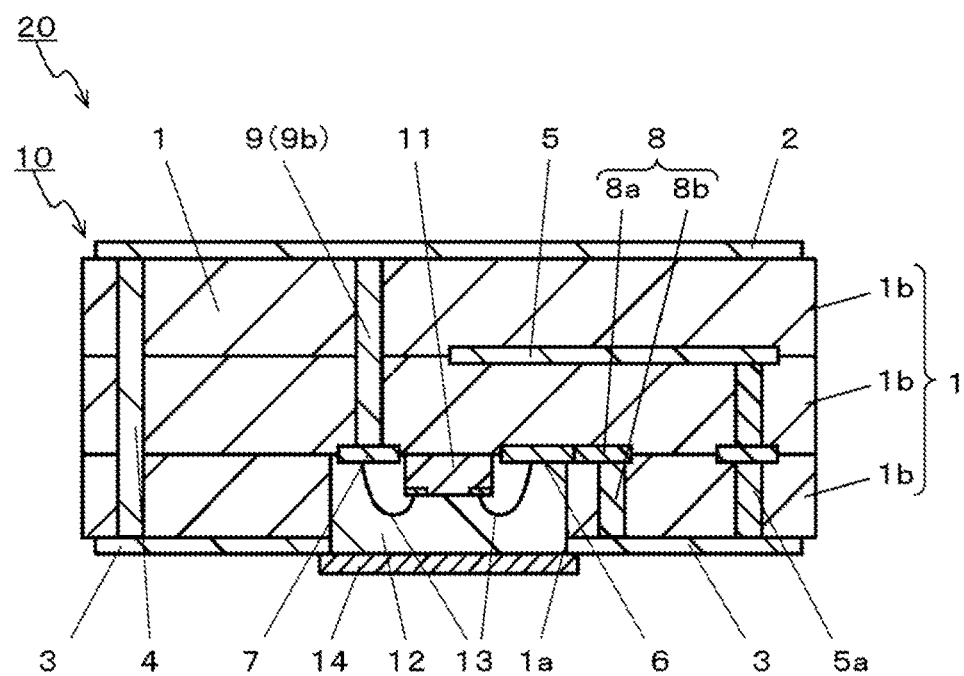
FIGS. 15A and 15B illustrate another example of the RFID tag according to the eighth embodiment, where
Figure 15B:
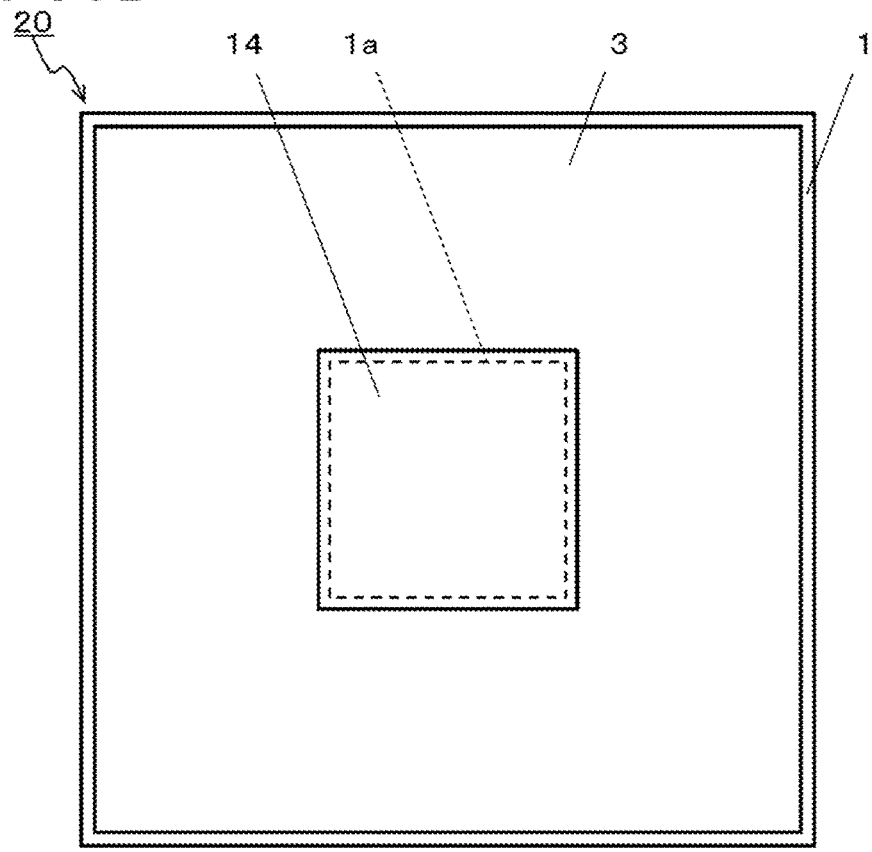
Figure 16A:
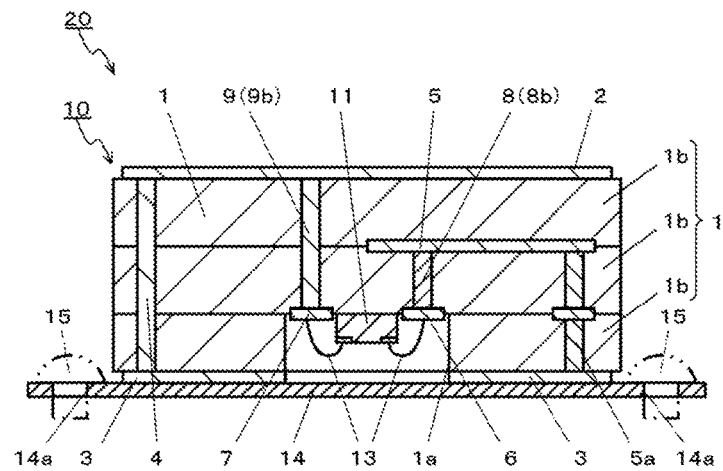
FIGS. 16A and 16B illustrate still another example of the RFID tag according to the eighth embodiment, where
Figure 16B:
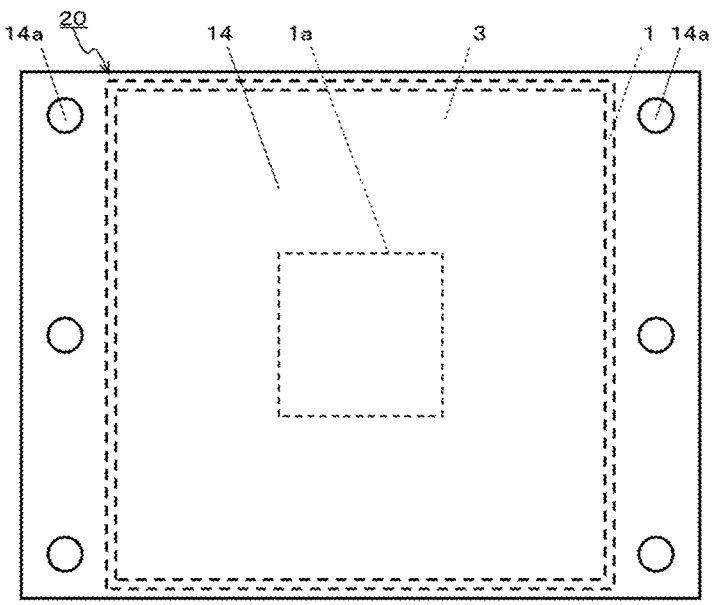
Figure 17A:
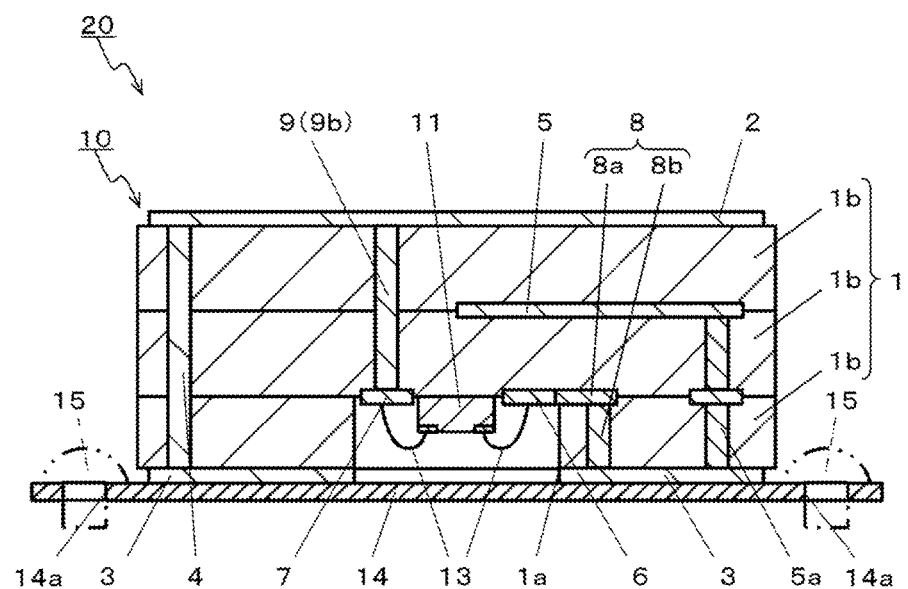
FIGS. 17A and 17B illustrate still another example of the RFID tag according to the eighth embodiment, where
Figure 17B:
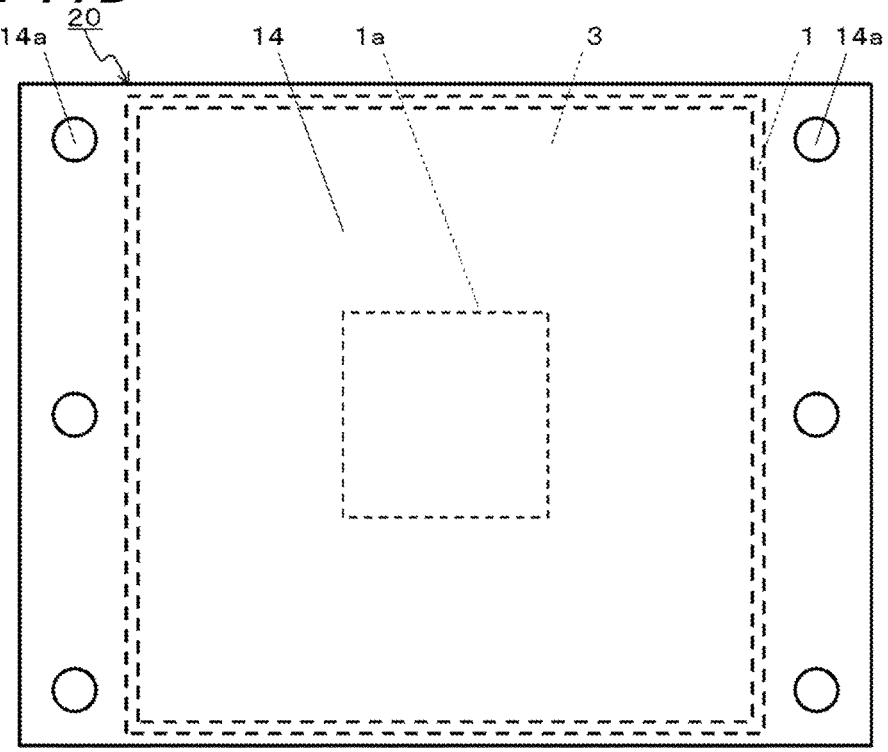

FIGS. 13A and 13B illustrate a seventh embodiment of the RFID tag 20 according to the embodiment of the invention. FIG. 13A is a sectional view and FIG. 13B is a bottom view. In the example illustrated in FIG. 1A of the first embodiment, the first electrode 6 is electrically connected to the capacitance conductor 5 by the first connection conductor 8 (the first through conductor 8b) extending from the inside of the recess 1a to the capacitance conductor 5. However, in an example illustrated in FIGS. 13A and 13B, the first electrode 6 and the capacitance conductor 5 are connected to each other by the first connection conductor 8, which is not the first through conductor 8b but the first internal wiring conductor 8a. Portions in FIGS. 13A and 13B that are the same as those in FIGS. 1A and 1B are given the same reference numerals. The first electrode 6 and the first internal wiring conductor 8a are substantially integrated with each other. Therefore, it can be said that the first electrode 6 and the capacitance conductor 5 are directly connected to each other. Since the capacitance conductor 5 and the first electrode 6 are disposed between the same insulating layers 1b and the first connection conductor 8 does not include the first through conductor 8b that penetrates the insulating layer 1b, the above-described configuration is advantageous in the viewpoint of achieving reduction in thickness of the RFID tag board 10 and reduction in thickness as the RFID tag 20.

Note that, when the capacitance conductor 5 and the first electrode 6 are disposed between the same insulating layers 1b, the area of the capacitance conductor 5 is decreased corresponding to a portion thereof that overlaps with the recess 1a. Therefore, In the example illustrated in FIGS. 13A and 13B, the width of the capacitance conductor 5 is larger than that in the examples illustrated in FIGS. 1A and 2A.

Eighth Embodiment

FIGS. 14A to 17B illustrate an eighth embodiment of the RFID tag 20 according to the embodiment of the disclosure. For each drawing, FIGS. 14A, 15A, 16A and 17A are a sectional view and FIGS. 14B, 15B, 16B and 17B are a bottom view. In examples illustrated in FIGS. 14A to 17B, the RFID tag 20 includes a conductive lid 14 that covers the recess 1a. The examples illustrated in FIGS. 14A to 16B are examples in which the RFID tag board 10 in the example illustrated in FIG. 1A is used. The examples illustrated in FIGS. 15A, 15B, 17A and 17B are examples in which the RFID tag board 10 in the example illustrated in FIG. 1B is used. It is also possible to provide the RFID tag 20 with the conductive lid 14 by using the RFID tag board 10 in the examples illustrated in FIGS. 5A and 5B and the subsequent drawings. Portions in FIGS. 14A to 17B that are the same as those in FIGS. 1A and 1B are given the same reference numerals.

The RFID tag 20 is fixed to the article 40 by using, for example, a bonding material such as a resin adhesive or a double sided tape. If the article 40 is conductive, a capacitance component is formed between the upper surface conductor 2 and the article 40. Here, if the thickness of an adhesive that fixes the RFID tag 20 to the article 40 is changed, the distance between the upper surface conductor 2 and the article 40 is changed, the capacitance component formed therebetween is also changed, and the resonant frequency of the RFID tag 20 is shifted. The thickness of the above-described bonding material does not usually become constant due to unevenness in thickness of the bonding material itself such as a double sided tape or due to unevenness in pressing force at the time of bonding. When the thickness of the bonding material is uneven, the distance between the upper surface conductor 2 and the article 40 becomes uneven and the resonant frequency of the RFID tag 20 becomes uneven. Therefore, the articles 40 may include an article 40 that can communicate with the reader/writer 31 and an article 40 that cannot communicate with the reader/writer 31 even when the articles 40 are provided with the same RFID tags 20.

As in the examples illustrated in FIGS. 14A to 15B, when the RFID tag 20 is provided with the conductive lid 14 that covers the recess 1a, the capacitance component is formed between the upper surface conductor 2 and the conductive lid 14 instead of being formed between the upper surface conductor 2 and the article 40. Since the capacitance component is constant regardless of the thickness of the bonding material, unevenness in resonant frequency of the RFID tag 20 is suppressed.

The conductive lid 14 is fixed to the insulating substrate 1 while covering the recess 1a. In the examples illustrated in FIGS. 14A to 15B, the conductive lid 14 is disposed to overlap the ground conductor 3, is bonded to the ground conductor 3 by a bonding material (not shown), and is fixed to the insulating substrate 1 via the ground conductor 3. The conductive lid 14 and the ground conductor 3 can be electrically connected to each other. The conductive lid 14 also functions as a ground conductor and the same effect as when the size of the ground conductor 3 is increased can be achieved. Therefore, no capacitance component is formed between the conductive lid 14 and the ground conductor 3 and a shift in resonant frequency of the RFID tag 20 due to a change in capacity value, which is caused by variation in attachment position of the conductive lid 14 or unevenness in interval between the conductive lid 14 and the upper surface conductor 2, is suppressed and the resonant frequency is stabled. When electrically connecting the conductive lid 14 and the ground conductor 3 to each other and fixing the conductive lid 14 to the insulating substrate 1, the conductive lid 14 and the ground conductor 3 may be mechanically connected to each other by using a bonding material after electrically connecting the conductive lid 14 and the ground conductor 3 to each other by bring the conductive lid 14 and the ground conductor 3 into contact with each other and electrical connection between the conductive lid 14 and the ground conductor 3 and mechanical bonding between the conductive lid 14 and the ground conductor 3 may be performed at the same time by using a conductive bonding material.

If a configuration, in which there is no non-conductive portion between the conductive lid 14 and the ground conductor 3 in plan view of the RFID tag 20 as seen from a lower surface side (the ground conductor 3 side), is adopted, a capacitance component is not formed between the upper surface conductor 2 and the article 40 through the non-conductive portion, which is favorable. In the examples illustrated in FIGS. 14A to 15B, an opening of the ground conductor 3 and an opening of the recess 1a of the insulating substrate 1 coincide with each other and there is no non-conductive portion (a portion with no conductor) between the recess 1a and the ground conductor 3. Therefore, since the conductive lid 14 that is larger than the opening of the recess 1a covers the recess 1a, an outer peripheral portion of the conductive lid 14 overlaps with the ground conductor 3, and thus a configuration in which there is no non-conductive portion in plan view can be achieved. If the opening of the ground conductor 3 is larger than the opening of the recess 1a, the conductive lid 14 that is larger than the opening of the ground conductor 3 may be used such that the outer peripheral portion of the conductive lid 14 overlaps with the ground conductor 3. If the conductive lid 14 is smaller than the opening of the ground conductor 3, a conductive substance may be disposed between the conductive lid 14 and the ground conductor 3. For example, the outer peripheral portion of the conductive lid 14 and the ground conductor 3 may be connected to each other by using a conductive bonding material such as a conductive adhesive or the like. The opening of the ground conductor 3 is not formed to be extremely larger than the opening of the recess 1a usually and thus almost no capacitance component is formed between the upper surface conductor 2 and the article 40 if the conductive lid 14 covers the recess 1a but it is possible to more reliably suppress formation of the capacitance component.

Examples of the conductive lid 14 include metal such as copper, stainless steel, and a Fe—Ni—Co alloy, conductive resin in which conductive particles such as metal are dispersed in an insulating material such as resin, and a material made of carbon. Alternatively, a substance obtained by providing a conductive film on a surface of an insulating plate may also be used. For example, a metal film may be provided on a resin plate, a ceramic plate, or the like through electroless plating or a substance obtained by providing a metalized layer on a ceramic plate or a substance obtained by pasting a metal foil on a resin board may also be used. A plate member formed of these materials may be bonded as the conductive lid 14 by using a bonding material. If the conductive lid 14 is formed of metal, for corrosion protection or improvement in bonding properties of a brazing material or solder, a plating coat of Ni, Au, or the like may be formed on a surface, for example. If the insulating substrate 1 is formed of a ceramic material and the conductive lid 14 is formed of metal, the conductive lid 14 with a high bonding reliability is achieved when a Fe—Ni—Co alloy, of which the thermal expansion coefficient is close to that of a ceramic material, is used as the conductive lid 14. If the recess 1a is air-tightly sealed by the conductive lid 14 and a bonding material, the sealing resin 12 may not be provided. If the recess 1a is sealed by the sealing resin 12, it is possible to form and bond the conductive lid 14 by applying liquid conductive resin on the sealing resin 12 and curing the liquid conductive resin and it is also possible to achieve electrical connection with the ground conductor 3 at the same time when the conductive resin is applied from a position above the sealing resin 12 in the recess 1a to a position above the ground conductor 3.

Examples of a conductive bonding material for fixing the conductive lid 14 to the insulating substrate 1 include metal such as solder and an AuSn wax and a substance obtained by mixing conductive particles such as metal into an insulating material such as resin or glass, and examples of an insulating bonding material for fixing the conductive lid 14 to the insulating substrate 1 include glass or a resin adhesive.

The size of the conductive lid 14 in plan view may be any size as long as the recess 1a can be covered and may be a size larger than that of the insulating substrate 1 as in the examples illustrated in FIGS. 16A to 17B. Even when a portion of the upper surface conductor 2 does not overlap with the ground conductor 3 in plan view due to positional deviation or the like, since the upper surface conductor 2 overlaps with the conductive lid 14 that is larger than the insulating substrate 1, it is possible to suppress the above-described shift in resonant frequency which is caused by a change in capacity component. Since it is possible to increase the adhesion area between the RFID tag 20 and the article 40, it is possible to increase the bonding reliability. As in the examples illustrated in FIGS. 16A to 17B, a through hole 14a may be provided in a portion of the conductive lid 14 that protrudes from the insulating substrate 1 and a screw hole may be provided in the article 40 such that the article 40 is fixed by using a screw 15. Even it is possible to firmly fix the RFID tag 20 to the article 40 and it is possible to achieve the RFID tag 20 with a high reliability. It is possible to efficiently release heat, which is generated from the RFID tag 20, toward the article 40 via the screw 15 and the bonding material. In the examples illustrated in FIGS. 16A to 17B, the conductive lid 14 has a rectangular shape that greatly protrudes with respect to the insulating substrate 1 in a right-left direction in the drawings. However, the shape of the conductive lid 14 is not limited to the rectangular shape and the conductive lid 14 may have a square shape and only a portion corresponding to the screw hole formed in the article 40 may protrude.

In the embodiment and each of modification examples, a distance D1 (refer to FIGS. 1A and 1B) between the capacitance conductor 5 and the upper surface conductor 2 may be set to be equal to or smaller than one-fourth of a distance D2 (refer to FIGS. 1A and 1B) between the ground conductor 3 and the upper surface conductor 2. If the distances are set as described such that D1/D2≤¼(D2≥4×D1) is satisfied, it is possible to decrease the distance D1 between the capacitance conductor 5 and the upper surface conductor 2, which contribute to achieving a small-sized antenna, while securing a large distance D2 between the ground conductor 3 and the upper surface conductor 2, which contribute to achieving a high-gain antenna, and thus it is possible to increase the gain of the RFID tag 20 and to decrease the size of the RFID tag 20. It is possible to secure a thickness (D2) of the insulating substrate 1 necessary for providing the recess 1*a* and thus it is possible to realize the small RFID tag 20.

REFERENCE SIGNS LIST

1 insulating substrate
1*a* recess
1*b* insulating layer
2 upper surface conductor
3 ground conductor
4 short-circuit portion through conductor
5 capacitance conductor
5*a* capacitance portion through conductor
6 first electrode
7 second electrode
8 first connection conductor
8*a* first internal wiring conductor
8*b* first through conductor
8*c* recess side-surface conductor
9 second connection conductor
9*a* second internal wiring conductor
9*b* second through conductor
10 RFID tag board
11 semiconductor element
12 sealing resin
13 bonding wire
14 conductive lid
15 screw
20 RFID tag
30 RFID system
31 reader/writer
32 antenna
33 substrate
40 article

The invention claimed is:

1. An RFID tag board comprising:
an insulating substrate with an upper surface and a lower surface with a recess;
an upper surface conductor on the upper surface of the insulating substrate;
a ground conductor on the lower surface of the insulating substrate, the ground conductor being electrically connected to the upper surface conductor by a short-circuit portion through conductor that penetrates the insulating substrate in a thickness direction;
a capacitance conductor in the insulating substrate, the capacitance conductor facing a portion of the upper surface conductor;
a capacitance portion through conductor that penetrates the insulating substrate in the thickness direction from the capacitance conductor to the ground conductor; and
a first electrode and a second electrode in the recess, the first electrode being electrically connected to the capacitance conductor or the ground conductor by a first connection conductor and the second electrode being electrically connected to the upper surface conductor via a second connection conductor.

2. The RFID tag board according to claim 1, wherein the first electrode is electrically connected to the capacitance conductor by the first connection conductor.

3. The RFID tag board according to claim 2, wherein the second electrode is electrically connected to the upper surface conductor by the second connection conductor.

4. The RFID tag board according to claim 3, wherein a distance between the capacitance conductor and the upper surface conductor is equal to or smaller than one-fourth of a distance between the ground conductor and the upper surface conductor.

5. An RFID tag comprising:
the RFID tag board according to claim 3; and
a semiconductor element in the recess of the RFID tag board, the semiconductor element being electrically connected to the first electrode and the second electrode.

6. The RFID tag board according to claim 2, wherein a distance between the capacitance conductor and the upper surface conductor is equal to or smaller than one-fourth of a distance between the ground conductor and the upper surface conductor.

7. An RFID tag comprising:
the RFID tag board according to claim 2; and
a semiconductor element in the recess of the RFID tag board, the semiconductor element being electrically connected to the first electrode and the second electrode.

8. The RFID tag board according to claim 1, wherein the first electrode is electrically connected to the ground conductor by the first connection conductor.

9. The RFID tag board according to claim 8, wherein the second electrode is electrically connected to the short-circuit portion through conductor by the second connection conductor and is electrically connected to the upper surface conductor.

10. The RFID tag board according to claim 8, wherein the second electrode is electrically connected to the ground conductor by the second connection conductor and is electrically connected to the upper surface conductor.

11. The RFID tag board according to claim 8, wherein the upper surface conductor and the ground conductor are electrically connected to each other by a plurality of short-circuit portion through conductors that penetrate the insulating substrate in the thickness direction.

12. The RFID tag board according to claim 8, wherein the capacitance conductor and the ground conductor are electrically connected to each other by a plurality of capacitance portion through conductors that penetrates the insulating substrate in the thickness direction.

13. The RFID tag board according to claim 8, wherein a distance between the capacitance conductor and the upper surface conductor is equal to or smaller than one-fourth of a distance between the ground conductor and the upper surface conductor.

14. An RFID tag comprising:
the RFID tag board according to claim 8; and
a semiconductor element in the recess of the RFID tag board, the semiconductor element being electrically connected to the first electrode and the second electrode.

15. The RFID tag according to claim 14, further comprising:
a conductive lid that covers the recess.

16. An RFID system comprising:
the RFID tag according to claim 14; and
a reader/writer comprising an antenna that transmits and receives a radio wave to and from the upper surface conductor of the RFID tag.

17. The RFID tag board according to claim 1, wherein a distance between the capacitance conductor and the upper surface conductor is equal to or smaller than one-fourth of a distance between the ground conductor and the upper surface conductor.

18. An RFID tag comprising:
the RFID tag board according to claim 1; and
a semiconductor element in the recess of the RFID tag board, the semiconductor element being electrically connected to the first electrode and the second electrode.

19. The RFID tag according to claim 18, further comprising:
a conductive lid that covers the recess.

20. An RFID system comprising:
the RFID tag according to claim 18; and
a reader/writer comprising an antenna that transmits and receives a radio wave to and from the upper surface conductor of the RFID tag.

* * * * *